(12) United States Patent
Makinen et al.

(10) Patent No.: US 9,123,258 B2
(45) Date of Patent: Sep. 1, 2015

(54) INTERFACE APPARATUS FOR TOUCH INPUT AND TACTILE OUTPUT COMMUNICATION

(75) Inventors: Ville Makinen, Espoo (FI); Petro Suvanto, Vantaa (FI); Jukka Linjama, Espoo (FI)

(73) Assignee: Senseg Ltd. (FI)

( * ) Notice: Subject to any disclaimer, the term of this patent is extended or adjusted under 35 U.S.C. 154(b) by 600 days.

(21) Appl. No.: 12/993,784

(22) PCT Filed: May 19, 2009

(86) PCT No.: PCT/FI2009/050416
§ 371 (c)(1),
(2), (4) Date: Nov. 19, 2010

(87) PCT Pub. No.: WO2009/141502
PCT Pub. Date: Nov. 26, 2009

(65) Prior Publication Data
US 2011/0074733 A1    Mar. 31, 2011

(30) Foreign Application Priority Data

May 19, 2008 (FI) .................................. 20085475 U
Sep. 17, 2008 (FI) ..................... PCT/FI2008/050514

(51) Int. Cl.
*G06F 3/01* (2006.01)
*G06F 3/0354* (2013.01)
(Continued)

(52) U.S. Cl.
CPC .............. *G09B 21/004* (2013.01); *G06F 3/016* (2013.01); *G06F 3/03547* (2013.01); *H03K 17/962* (2013.01); *G06F 2203/0339* (2013.01); *H03K 17/9622* (2013.01)

(58) Field of Classification Search
CPC ............................. G06F 3/016; G06F 3/03547
See application file for complete search history.

(56) References Cited

U.S. PATENT DOCUMENTS 3,267,931 A    8/1966    Phuarich et al.
4,210,905 A    7/1980    Coons
(Continued)

FOREIGN PATENT DOCUMENTS

CN    102099769 B    6/2014
EP    1731993 A1    12/2006
(Continued)

OTHER PUBLICATIONS

"U.S. Appl. No. 14/040,389, Non Final Office Action mailed Apr. 24, 2014", 8 pgs.
(Continued)

*Primary Examiner* — Kumar Patel
*Assistant Examiner* — Sejoon Ahn
(74) *Attorney, Agent, or Firm* — Schwegman Lundberg & Woessner, P.A.

(57) ABSTRACT

An interface apparatus (1600A) comprises a surface (1642) touchable by a finger (120). The surface has a touch-sensitive area with a predetermined position (1646), to which a function is assigned. The finger's presence at the predetermined position (1646) is detected. An electrosensory stimulus is generated to the finger by applying an alternating electrical drive to one or more electrodes (1662). Each electrode is provided with an insulator, which prevents DC flow from the electrode to the finger and a capacitive coupling over the insulator is formed between the electrode (1662) and the finger (120). The capacitive coupling and electrical drive are dimensioned to produce an electrosensory sensation, independently of mechanical vibration of the electrode. The electrosensory stimulus is varied temporally based on the detected presence or absence of the of the finger (120) near the at least one touch-sensitive area having the predetermined position (1646).

36 Claims, 10 Drawing Sheets

(51) Int. Cl.
  *G09B 21/00* (2006.01)
  *H03K 17/96* (2006.01)

(56) References Cited

U.S. PATENT DOCUMENTS

| | | | |
|---|---|---|---|
| 4,429,413 A | 1/1984 | Edwards | |
| 5,436,565 A | 7/1995 | Gammell et al. | |
| 5,929,573 A | 7/1999 | Louwers et al. | |
| 5,933,102 A | 8/1999 | Miller et al. | |
| 6,154,188 A * | 11/2000 | Learn et al. | 345/75.2 |
| 6,175,767 B1 | 1/2001 | Doyle, Sr. | |
| 6,369,806 B1 * | 4/2002 | Endo et al. | 345/174 |
| 6,815,657 B2 | 11/2004 | Toyoshima et al. | |
| 7,019,623 B2 | 3/2006 | Klausner et al. | |
| 7,124,041 B1 | 10/2006 | Johnson et al. | |
| 7,321,311 B2 | 1/2008 | Rieth et al. | |
| 7,418,108 B2 | 8/2008 | Oser | |
| 7,486,273 B1 * | 2/2009 | Aviles et al. | 345/156 |
| 7,520,365 B2 | 4/2009 | Fukuba et al. | |
| 7,692,078 B2 * | 4/2010 | Hayashi et al. | 84/22 |
| 7,696,860 B2 * | 4/2010 | Gilson et al. | 340/407.1 |
| 7,924,144 B2 | 4/2011 | Makinen et al. | |
| 7,982,588 B2 | 7/2011 | Makinen et al. | |
| 7,982,721 B2 * | 7/2011 | Hio | 345/173 |
| 8,026,798 B2 | 9/2011 | Makinen et al. | |
| 8,174,373 B2 | 5/2012 | Makinen et al. | |
| 8,570,163 B2 | 10/2013 | Makinen et al. | |
| 8,665,076 B2 * | 3/2014 | Okimoto et al. | 340/407.1 |
| 8,717,151 B2 * | 5/2014 | Forutanpour et al. | 340/407.1 |
| 8,766,933 B2 | 7/2014 | Makinen et al. | |
| 8,941,475 B2 | 1/2015 | Makinen et al. | |
| 2002/0093491 A1 | 7/2002 | Gillespie et al. | |
| 2002/0173823 A1 * | 11/2002 | English | 607/1 |
| 2003/0025721 A1 * | 2/2003 | Clapper et al. | 345/700 |
| 2003/0067449 A1 | 4/2003 | Yoshikawa et al. | |
| 2003/0213624 A1 | 11/2003 | Cross et al. | |
| 2004/0095330 A1 * | 5/2004 | Ling et al. | 345/173 |
| 2004/0104887 A1 | 6/2004 | Tsukamoto et al. | |
| 2004/0125079 A1 * | 7/2004 | Kaneko et al. | 345/156 |
| 2004/0150277 A1 | 8/2004 | Moriyasu | |
| 2004/0164971 A1 * | 8/2004 | Hayward et al. | 345/179 |
| 2004/0189617 A1 * | 9/2004 | Gerpheide et al. | 345/174 |
| 2004/0192423 A1 | 9/2004 | Nevermann | |
| 2004/0220485 A1 | 11/2004 | Rytky | |
| 2005/0030166 A1 | 2/2005 | Kraus et al. | |
| 2005/0041018 A1 * | 2/2005 | Philipp | 345/178 |
| 2005/0057528 A1 | 3/2005 | Kleen | |
| 2006/0033722 A1 | 2/2006 | Chiu et al. | |
| 2006/0046031 A1 | 3/2006 | Janevski | |
| 2006/0066588 A1 * | 3/2006 | Lyon et al. | 345/173 |
| 2006/0115348 A1 | 6/2006 | Kramer | |
| 2006/0119585 A1 | 6/2006 | Skinner | |
| 2006/0152497 A1 * | 7/2006 | Rekimoto | 345/173 |
| 2006/0250354 A1 * | 11/2006 | Takata et al. | 345/156 |
| 2006/0274048 A1 | 12/2006 | Spath et al. | |
| 2006/0279537 A1 * | 12/2006 | Kim et al. | 345/156 |
| 2007/0030246 A1 * | 2/2007 | Tremblay et al. | 345/156 |
| 2007/0268248 A1 * | 11/2007 | Zilles et al. | 345/156 |
| 2008/0143683 A1 | 6/2008 | Hotelling | |
| 2008/0143693 A1 | 6/2008 | Schena | |
| 2008/0158172 A1 * | 7/2008 | Hotelling et al. | 345/173 |
| 2008/0158183 A1 | 7/2008 | Hotelling et al. | |
| 2008/0162997 A1 * | 7/2008 | Vu et al. | 714/27 |
| 2008/0174415 A1 | 7/2008 | Tanida et al. | |
| 2008/0218488 A1 * | 9/2008 | Yang et al. | 345/173 |
| 2008/0251364 A1 * | 10/2008 | Takala et al. | 200/341 |
| 2009/0002328 A1 | 1/2009 | Ullrich et al. | |
| 2009/0079550 A1 | 3/2009 | Makinen et al. | |
| 2009/0102805 A1 * | 4/2009 | Meijer et al. | 345/173 |
| 2009/0109007 A1 | 4/2009 | Makinen et al. | |
| 2009/0128374 A1 * | 5/2009 | Reynolds et al. | 341/33 |
| 2009/0174671 A1 * | 7/2009 | Tachi et al. | 345/173 |
| 2009/0201247 A1 * | 8/2009 | Aviles et al. | 345/156 |
| 2009/0322355 A1 * | 12/2009 | Day et al. | 324/691 |
| 2010/0044120 A1 * | 2/2010 | Richter | 178/18.01 |
| 2010/0085169 A1 * | 4/2010 | Poupyrev et al. | 340/407.2 |
| 2010/0188364 A1 * | 7/2010 | Lin et al. | 345/174 |
| 2010/0231508 A1 * | 9/2010 | Cruz-Hernandez et al. | 345/156 |
| 2010/0231540 A1 * | 9/2010 | Cruz-Hernandez et al. | 345/173 |
| 2010/0259503 A1 * | 10/2010 | Yanase et al. | 345/174 |
| 2010/0283762 A1 * | 11/2010 | Takusa | 345/174 |
| 2011/0012845 A1 * | 1/2011 | Rothkopf et al. | 345/173 |
| 2011/0109584 A1 | 5/2011 | Linjama et al. | |
| 2011/0109588 A1 | 5/2011 | Makinen et al. | |
| 2011/0187516 A1 | 8/2011 | Makinen et al. | |
| 2011/0254799 A1 | 10/2011 | Makinen et al. | |
| 2012/0242463 A1 | 9/2012 | Makinen et al. | |
| 2014/0125468 A1 | 5/2014 | Makinen et al. | |
| 2014/0266648 A1 | 9/2014 | Makinen et al. | |

FOREIGN PATENT DOCUMENTS

| | | |
|---|---|---|
| EP | 1939712 A1 | 7/2008 |
| FI | 20080213 | 11/2008 |
| JP | 3543097 B2 | 7/2004 |
| WO | WO-02073587 A1 | 9/2002 |
| WO | WO-2004051451 A2 | 6/2004 |
| WO | WO-2007111909 A2 | 10/2007 |
| WO | WO-2009037379 | 3/2009 |
| WO | WO-2010037894 A1 | 4/2010 |

OTHER PUBLICATIONS

"U.S. Appl. No. 14/040,389, Response filed Jul. 22, 2014 to Non Final Office Action mailed Apr. 24, 2014", 13 pgs.

"U.S. Appl. No. 14/294,002, Preliminary Amendment filed Jun. 17, 2014", 8 pgs.

Mazzone, A., et al., "Novel actuators for haptic displays based on electroactive polymers", VRST '03 Proceedings of the ACM symposium on Virtual Reality Software and Technology, (2003), pp. 196-204.

"U.S. Appl. No. 14/040,389, Notice of Allowance mailed Sep. 17, 2014", 5 pgs.

"International Application Serial No. PCT/FI2009/050416, International Search Report mailed Sep. 22, 2009", 6 pgs.

"International Application Serial No. PCT/FI2009/050416, Written Opinion mailed Sep. 22, 2009", 9 pgs.

"International Application Serial No. PCT/FI2009/050416,International Preliminary Report on Patentability mailed Aug. 27, 2010", 15 pgs.

Dietz, Paul, et al., "DiamondTouch: A Multi-User Touch Technology", UIST '01, (Nov. 2001), 219-226.

"U.S. Appl. No. 12/232,536, Non Final Office Action mailed Dec. 14, 2010", 7 pgs.

"U.S. Appl. No. 12/232,536, Notice of Allowance mailed Feb. 22, 2011", 5 pgs.

"U.S. Appl. No. 12/232,548, Non Final Office Action mailed Jan. 7, 2011", 10 pgs.

"U.S. Appl. No. 12/232,548, Preliminary Amendment filed Sep. 18, 2008".

"U.S. Appl. No. 12/232,548, Response filed Apr. 4, 2011 to Non-Final Office Action Received Jan. 7, 2011", 12 pgs.

"U.S. Appl. No. 12/232,548, Supplemental Preliminary Amendment filed Sep. 6, 2010", 5 pgs.

"U.S. Appl. No. 12/232.536. Response filed Feb. 8, 2011 to Non Final Office Action mailed Dec. 14, 2010", 9 pgs.

"U.S. Appl. No. 13/122,113, Preliminary Amendment filed Mar. 31, 2011", 7 pgs.

"International Application Serial No. PCT/FI2008/050550, PCT Search Report mailed Jun. 12, 2009", 3 pgs.

Beebe, David J., et al., "A polyimide-on-silicon electrostatic fingertip tactile display", IEEE 17th Annual Conference Engineering in Medicine and Biology Society, vol. 2, (1995), 1545-1546.

Gunther, "Skinscape: A Tool for Composition in the Tactile Modality", Massachusetts Institute of Technology, (2001).

Kaczmarek, K. A, et al., "Electrotactile and vibrotactile displays for sensory substitution systems", IEEE Transactions on Biomedical Engineering, 38(1), (Jan. 1991), 1-16.

(56) References Cited

OTHER PUBLICATIONS

Kaczmarek, Kurt A., et al., "Polarity Effect in Electrovibration for Tactile Display", IEEE Transactions on Biomedical Engineering, 53(10), (Oct. 2006), 2047-2054.

Kajimoto, H, et al., "Electro-Tactile Display with Tactile Primary Color Approach", Proceedings of International Conference on Intelligent Robots and Systems, (2004), 10 pgs.

Kajimoto, H., et al., "Psychophysical evaluation of receptor selectivity in electro-tactile display", 13th International Symposium on Measurement and Control in Robotics (ISMCR), Madrid, Spain, http://files.tachilab.org/intconf2000/kajimoto200312ISMCR.pdf, (2003), 4 pgs.

Kajimoto, H., et al., "Tactile Feeling Display using Functional Electrical Stimulation", 9th International Conference on Artificial Reality and Tele-Existence (ICAT'99), Tokyo, Japan; [online] Accessed from http://files.tachilab.org/intconf1900/kajimoto1999ICAT.pdf (1999), 8 pgs.

Kuroki, S., et al., "Proposal for tactile sense presentation that combines electrical and mechanical stimulus", Second Joint EuroHaptics Conference, 2007 and Symposium on Haptic Interfaces for Virtual Environment and Teleoperator Systems. World Haptics 2007., (2007), 121-126.

Linjama, Jukka, et al., "E-Sense screen: Novel haptic display with Capacitive Electrosensory Interface", Demo paper Submitted for HAID 09, 4thWorkshop for Haptic and Audio Interaction Design, Dresden, Germany, (Sep. 10-11, 2009), 1-2.

Pfeiffer, E. A, "Electrical stimulation of sensory nerves with skin electrodes for research, diagnosis, communication and behavioral conditioning: a survey", Med Biol Eng., 6(6), (Nov. 1968), 637-51.

Reilly, J. P, et al., "Electrocutaneous Stimulation with High Voltage Capacitive Discharges", IEEE Transactions on Biomedical Engineering, Volume: BME-30 , Issue: 10, (1983), 631-641.

Yamamoto, A., et al., "Electrostatic Tactile Display with Thin Film Slider and Its Application to Tactile Telepresentation Systems", IEEE Transactions on Visualization and Computer Graphics, 12(2), (Mar./Apr. 2006), 168-177.

"U.S. Appl. No. 12/793,563, Response filed Mar. 11, 2013 to Non Final Office Action mailed Nov. 13, 2012", 15 pgs.

"U.S. Appl. No. 12/793,563, Final Office Action mailed Sep. 20, 2013", 18 pgs.

"U.S. Appl. No. 12/793,563, Non Final Office Action mailed Apr. 12, 2013", 17 pgs.

"U.S. Appl. No. 12/793,563, Response to Non Final Office Action mailed Apr. 12, 2013", 17 pgs.

"U.S. Appl. No. 12/900,305 , Response filed Dec. 19, 2013 to Final Office Action mailed Sep. 20, 2013", 14 pgs.

"U.S. Appl. No. 12/900,305, Final Office Action mailed Sep. 20, 2013", 20 pgs.

"U.S. Appl. No. 12/900,305, Non Final Office Action mailed Apr. 17, 2013", 18 pgs.

"U.S. Appl. No. 12/900,305, Notice of Allowance mailed Feb. 25, 2014", 7 pgs.

"U.S. Appl. No. 12/900,305, Response filed Mar. 11, 2013 to Restriction Requirement mailed Nov. 14, 2012", 7 pgs.

"U.S. Appl. No. 12/900,305, Response to Non Final Office Action mailed Apr. 17, 2013", 17 pgs.

"U.S. Appl. No. 13/432,329, Notice of Allowance mailed Apr. 2, 2013", 6 pgs.

"U.S. Appl. No. 13/432,329, Notice of Allowance mailed Jul. 1, 2013", 6 pgs.

"U.S. Appl. No. 13/432,329, Response filed Mar. 8, 2013 to Final Office Action mailed Jan. 8, 2013", 9 pgs.

"Chinese Application Serial No. 200980128363.0, Office Action mailed Feb. 5, 2013", 7 pgs.

"Chinese Application Serial No. 200980128363.0, Office Action mailed Oct. 21, 2013", 7 pgs.

"Chinese Application Serial No. 200980128363.0, Response filed Jun. 19, 2013 to Office Action mailed Feb. 5, 2013", 11 pgs.

Agarwal, A K, et al., "A hybrid natural/artificial electrostatic actuator for tactile stimulation", IEEE, ISBN 0-7803-7480-0, Abstract; sections II.A, II.B and III.A; figures 1-2, (2002), 341-345.

Beebe, D J, et al., "A Polyimide-on-silicon Electrostatic Fingertip Tactile Display", IEEE, ISBN 0-7803-2475-7, vol. 2, XP 010214849, whole document, (1997), 1545-1546.

Fukumoto, M., et al., "Active Click: Tactile Feedback for Touch Panels", New York: ACM, ISBN 1-58113-340-5, Whole document, (2001), 121-122.

Kaczmarek, K. A., et al., "Polarity Effect in Electrovibration for Tactile Display", IEEE Transactions on Biomedical Engineering, ISSN 0018-9294, vol. 53, No. 10, Figures 1-2; sections II: Methods: Apparatus, (Oct. 2006), 204-2054.

Poupyrev, I., et al., "Ambient Touch: Designing Tactile Interfaces for Handheld Devices.", New York: ACM, ISBN 1-58113-488-6, vol. 4, No. 2, Xp 001171567, abstract; section 'TouchEngine display', (2002), 51-60.

Rekimoto, J, et al., "SmartSkin: An Infrastructure for Freehand Manipulation on Interactive Surfaces.", New York: ACM, ISBN 1-58113-453-3, vol. 4, No. 1, XP 001099406, abstract; figure 2; section 'SmartSkin sensor architecture'; firgures 12-14; sections 'Interactions by using fingers and hand gestures' and 'Combination with tactile feedback', (2002), 113-120.

Tang, H., et al., "A Microfabricated Electrostatic Haptic Display for Persons with Visual Impairments", IEEE Transactions on Rehabilitation Engineering, ISSN 1063-6528, vol. 6, No. 3 XP 011053920, abstract; Figure 1; sections II.A, II.B and II.D, (Sep. 1998), 241-248.

Yamamoto, A., et al., "Electrostatic Tactile Display with Thin Film Slider and its Application to Tactile Telepresentation Systems", IEEE Transactiona on Visualization and Computer Graphics, ISSN 1077-2626, vol. 12, No. 2, Cited in the application abstract; figure 2; sections 3.1, 4.2.1, 6.2 and 6.3; figures 17-22, (Mar./Apr. 2006), 168-177.

U.S. Appl. No. 12/232,548, Notice of Allowance mailed Jun. 2, 2011, 5 pgs.

U.S. Appl. No. 12/793,563, Non Final Office Action mailed Nov. 13, 2012, 16 pgs.

U.S. Appl. No. 12/793,563, Response filed Sep. 10, 2012 to Restriction Requirement filed Aug. 10, 2012, 8 pgs.

U.S. Appl. No. 12/793,563, Restriction Requirement mailed Aug. 10, 2012, 5 pgs.

U.S. Appl. No. 12/900,305, Restriction Requirement mailed Nov. 14, 2012, 5 pgs.

U.S. Appl. No. 13/122,113, Notice of Allowance mailed Jun. 20, 2011, 11 pgs.

U.S. Appl. No. 13/171,078, Non Final Office Action mailed Nov. 17, 2011, 8 pgs.

U.S. Appl. No. 13/171,078, Notice of Allowance mailed Mar. 16, 2012, 5 pgs.

U.S. Appl. No. 13/171,078, Response filed Feb. 6, 2012 to Non Final Office Action mailed Nov. 17, 2011, 10 pgs.

U.S. Appl. No. 13/432,329, Final Office Action mailed Jan. 8, 2013, 9 pgs.

U.S. Appl. No. 13/432,329, Non Final Office Action mailed Aug. 8, 2012, 7 pgs.

U.S. Appl. No. 13/432,329, Response filed Nov. 7, 2012 to Non Final Office Action mailed Aug. 8, 2012, 10 pgs.

European Application Serial No. 09749986.7, Extended Search Report mailed Nov. 10, 2011, 8 pgs.

European Application Serial No. 09749986.7, Response filed May 30, 2012 to Extended Search Report mailed Nov. 10, 2011, 18 pgs.

International Application Serial No. PCT/FI2008/050550, International Preliminary Report on Patentability mailed Jun. 12, 2009, 6 pgs.

International Application Serial No. PCT/FI2008/050550, PCT Written Opinion mailed Jun. 12, 2009, 7 pgs.

Mallinckrodt, Edward, et al., "Perception by the Skin of Electrically Induced Vibrations", Science, 4, (1953), 277-278.

(56) References Cited

OTHER PUBLICATIONS

Strong, Robert M, et al., "An Electrotactile Display", IEEE Transactions on Man-Machine Systems, 11(1), (1970), 72-79.
"U.S. Appl. No. 14/294,002, Notice of Allowance mailed Feb. 20, 2015", 8 pgs.
"U.S. Appl. No. 14/294,002, Response filed Jan. 12, 2015 to Restriction Requirement mailed Nov. 8, 2014", 8 pgs.
"U.S. Appl. No. 14/294,002, Restriction Requirement mailed Nov. 18, 2014", 8 pgs.
"U.S. Appl. No. 14/569,472, Preliminary Amendment filed Dec. 17, 2014", 9 pgs.

\* cited by examiner

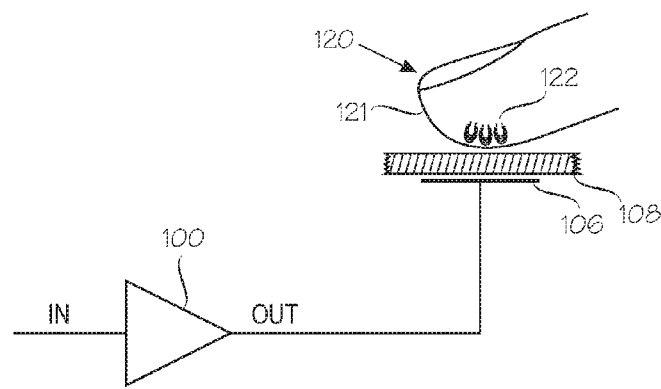
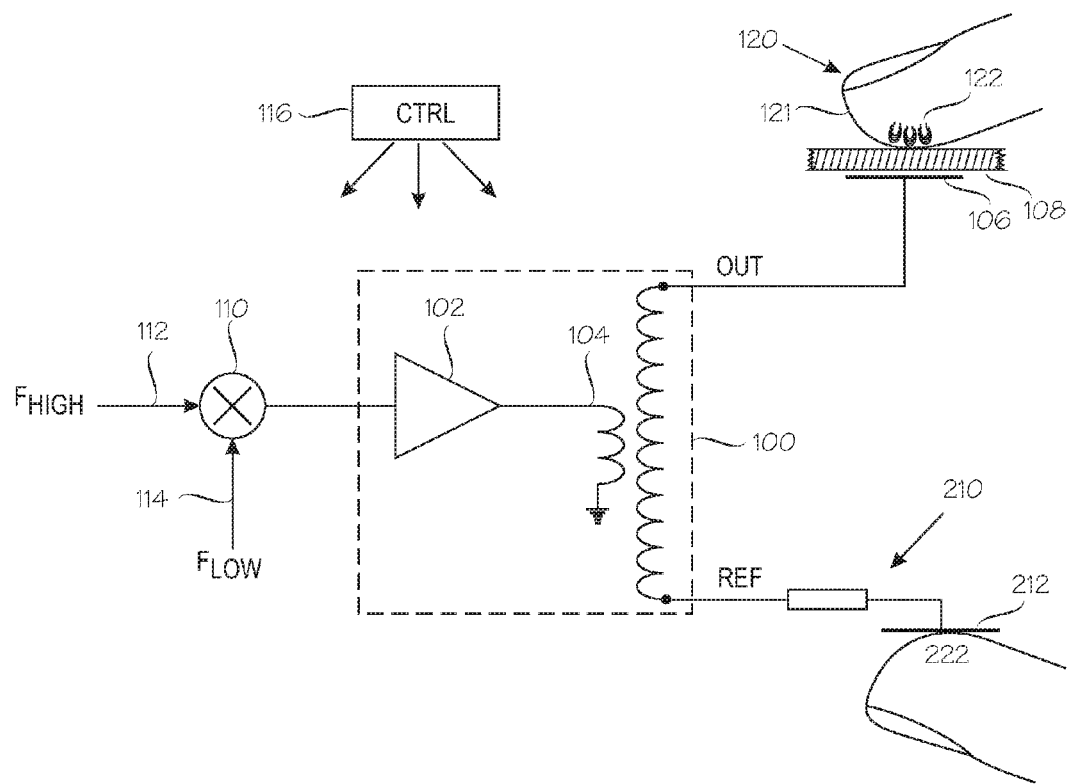

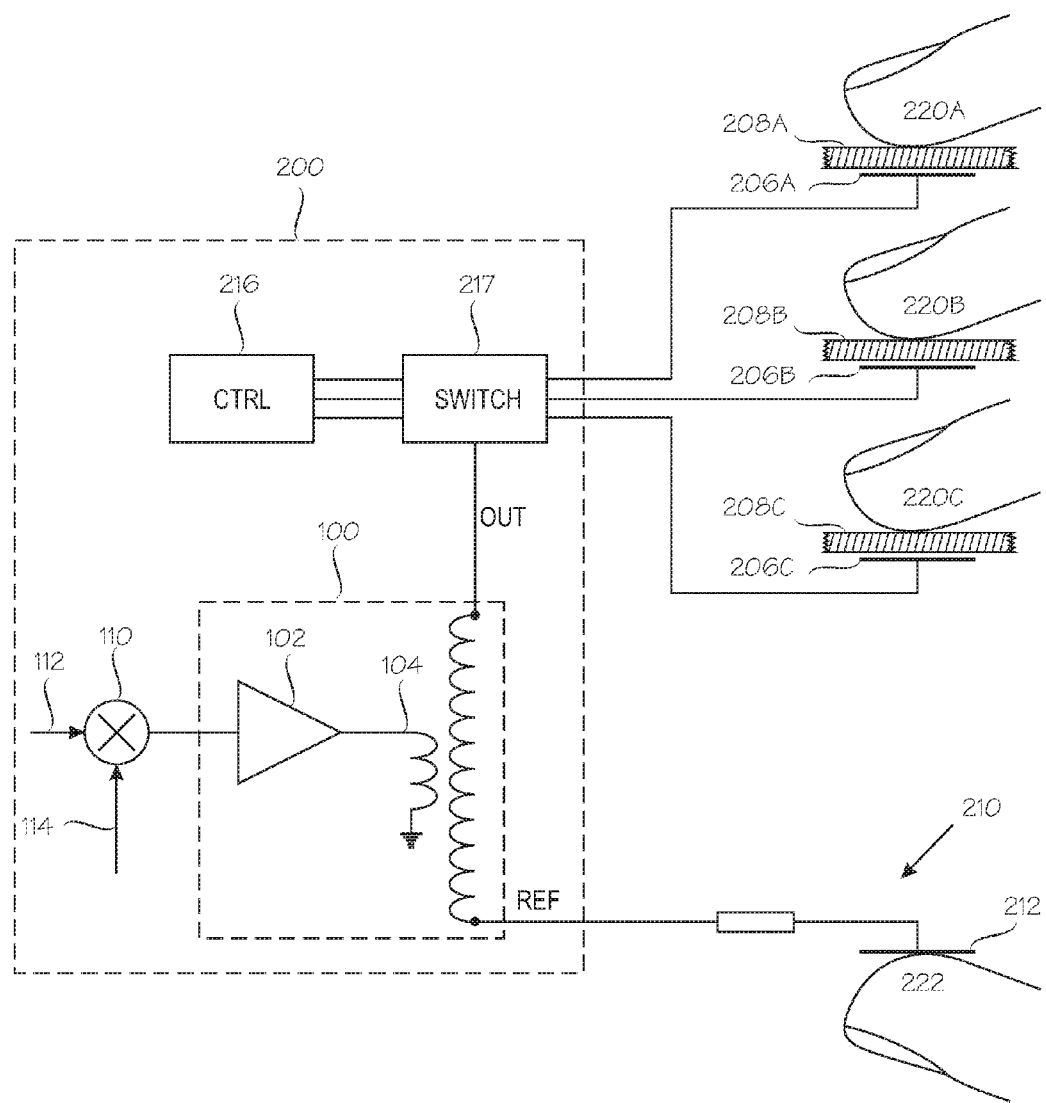

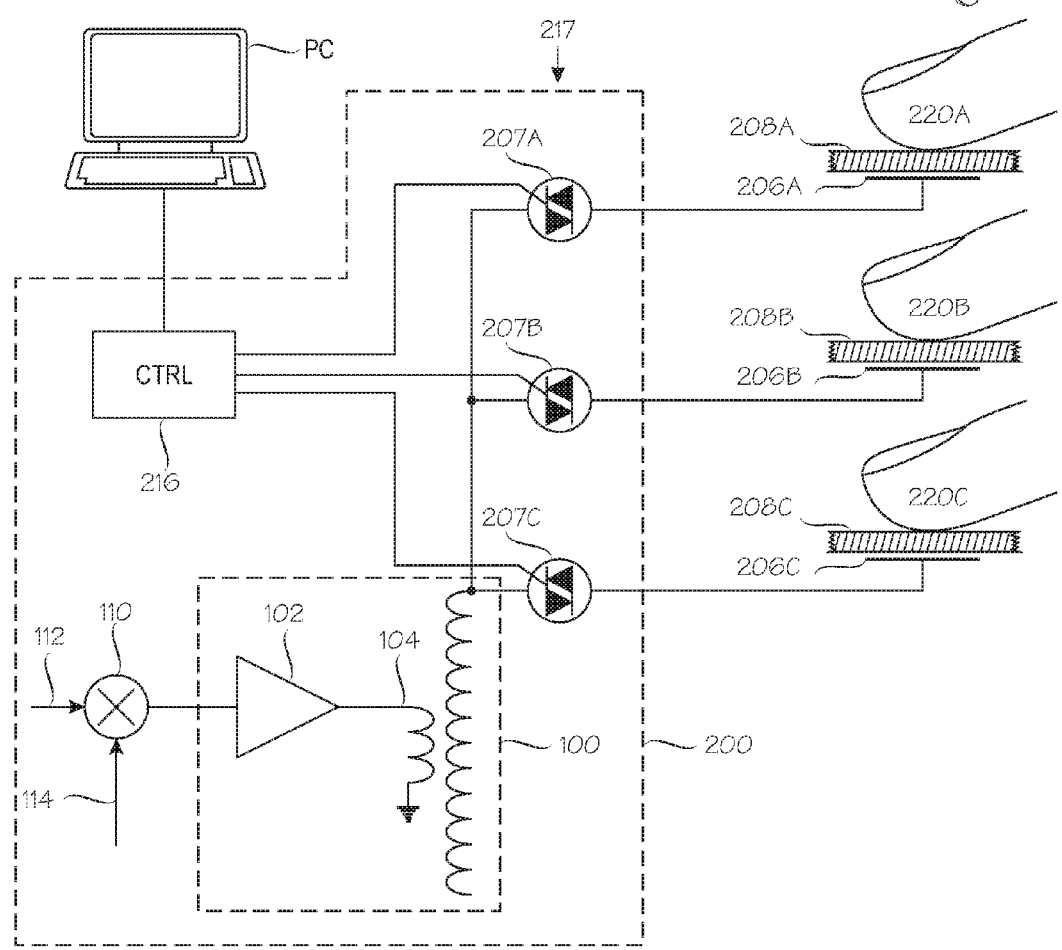

INTERFACE APPARATUS FOR TOUCH INPUT AND TACTILE OUTPUT COMMUNICATION

CROSS REFERENCE TO RELATED APPLICATION

This application is a nationalization under 35 U.S.C. 371 and claims the benefit of priority under 35 U.S.C. 120 to International Patent Application No. PCT/FI2009/050416, filed May 19, 2009, and published on Nov. 26, 2009 as WO/2009/141502, which claims the benefit of priority under 35 U.S.C. 120 to International Patent Application No. PCT/FI2008/050514, filed Sep. 17, 2008, and published on Mar. 26, 2009 as WO/2009/037379 and claims priority to and the benefit of Finnish Patent Application No. 20085475, filed May 19, 2008, all of which are incorporated herein by reference in their entireties.

BACKGROUND OF THE INVENTION

The invention relates to a touch device interface. By way of example, the inventive touch device interface can be used as a user-input section of a touch screen interface. Although a touch screen appears to be a unitary piece of hardware, it actually comprises an output device, namely a display or screen, and an input device which is sensitive to touching or approaching the surface of the display with a finger or stylus. Touch screens can be implemented by organizing an x-y matrix of infrared rays over the screen, in which case touching the display surface is not necessary. Alternatively the screen can be overlaid by a transparent pressure-sensitive switch matrix which is scanned in substantially similarly to the way electronic keyboard matrices are scanned. The layout of the switch matrix may resemble that of a general-purpose typewriter, or the layout may be dedicated to specific purposes or applications. Touch screen interfaces are frequently used in connection with laptop or palmtop computers, personal digital assistants ("PDA"), remote control devices, digital cameras, navigators, entertainment devices, and many other types of devices.

A problem with conventional touch screen interfaces is that the user of the touch screen interface must be able to see the layout of the switch matrix in order to be able to select a specific key to be activated ("pushed"). Seeing the layout of the switch matrix is not always possible or easy, and visually impaired persons are a prime example. Even in cases wherein the user could see the switch matrix layout, looking at the switch matrix layout may disturb the user, such as the driver of a car.

BRIEF DESCRIPTION OF THE INVENTION

An object of the invention is to develop a method and equipment so as to alleviate one or more of the problems identified above. In other words the object of the invention is to provide an improved touch screen interface which requires less visual attention from its user than prior art touch screen interfaces do. The object of the invention is attained by methods and equipment as specified in the attached independent claims. The dependent claims and the present description relate to specific embodiments of the invention.

An aspect of the invention is a interface apparatus according to claim 1. The interface apparatus according to claim 1, which provides two-way communication with the user, comprises a touch input section and a tactile output section. The term "section" implies that the touch input section and a tactile output section are comprised within the two-way interface apparatus. The touch input section comprises a surface arranged so as to be touched or approached by a body member, which typically is the user's finger. This surface may be called a touch surface. The touch surface has at least one touch-sensitive area having a predetermined position. The touch input section comprises or is operatively connectable to data processing means for assigning at least one function to the least one touch-sensitive area. The touch input section comprises presence-detecting means for detecting a presence or absence of a user's body member near the at least one touch-sensitive area. Touch-sensitive smart phones, car navigators, touch pads of laptop or palmtop computers, or the like provide Illustrative but non-restrictive examples of the touch input section. The data processing means comprises an appropriately programmed microprocessor with associated hardware. The microprocessor and its associated hardware can reside within the interface apparatus or in an external data processing system. The presence-detecting means are typically implemented by appropriate programming of the microprocessor: the surface touched or approached by the body member is typically arranged as an X-Y matrix which is scanned by the associated electronics of the touch input section. When the user's body member presses an area of the surface, one or more of the X lines are connected to one or more of the Y lines, and the X and Y coordinates of the connection are detected by the processor. The X and Y coordinates are typically compared with coordinates that define predetermined areas.

In an illustrative but non-restrictive example, the function assigned to the touch-sensitive area is providing an input to an application program, such as a selection of an option ("yes/no/cancel") or a selection of an act to be performed. The border or perimeter of the touch-sensitive area need not be a sharply-defined one, so long as it is possible to say that touching or approaching a point within the touch-sensitive area invokes the function assigned to the touch-sensitive area, while touching or approaching another point outside the area does not.

The number of functions assigned to a touch-sensitive area is not restricted to one. Instead it is possible to assign multiple functions to one, some or all touch-sensitive areas, such that a single touch ("click") invokes a first function, two touches within a predefined time window ("double click") invokes a second function, and so on.

An illustrative example of an interface apparatus which comprises the function-assigning means is a standalone device, such as a palmtop computer, a smart telephone or a remote controller. An illustrative example of a touch device which is connectable to the function-assigning means is an interface panel which does not contain any application-level programs but is connectable to an external data processing equipment executing one or more application-level programs which use the interface panel as an input device. In such environments it is beneficial to define an application programming interface (API), via which the application-level programs can accept input from a user, and optionally provide feedback to the user.

As regards functionality, the touch input section can be implemented via conventional technology. As stated earlier, the conventional technology causes the problem that the user must see what area(s) of the touch input section need to be pushed.

In order to solve the problems associated with conventional touch input technology, the inventive interface apparatus also comprises a tactile output section, which in turn comprises an electro-sensory stimulus generator for generating an electrosensory stimulus to the body member. The electro-sensory stimulus generator comprises one or more conducting electrodes, each conducting electrode being provided with an insulator wherein, when the body member is proximate to the conducting electrode, the insulator prevents flow of direct current from the conducting electrode to the body member and a capacitive coupling over the insulator is formed between the conducting electrode and the body member. The electro-sensory stimulus generator also comprises a high-voltage source for applying an electrical drive to the one or more conducting electrodes, wherein the electrical drive comprises a first frequency component in a frequency range between 1 Hz and 1000 Hz. The capacitive coupling and electrical drive are dimensioned to produce an electro-sensory sensation, independently of any mechanical vibration of the one or more conducting electrodes or insulators.

As stated earlier, the touch input section comprises presence-detecting means for detecting a presence or absence of a user's body member near the at least one touch-sensitive area. The tactile output section according to the invention is operatively coupled to the presence-detecting means and comprises stimulus-variation means, such that the stimulus-variation means are configured to receive an input from the presence-detecting means and to temporally vary the electro-sensory stimulus based on input from the presence-detecting means. The stimulus may be varied by varying one or more of the electrical parameters defining it, including drive voltage, frequency or the capacitive coupling.

The significance of such a stimulus-variation means may not be immediately apparent. Yet the stimulus-variation means provides a clear benefit, for the following reason. Touch input devices, such as touch-sensitive displays, may provide a large number of distinct predefined areas. In some cases, the number of distinct predefined areas roughly equals the size of the touch-sensitive display divided by the size of a typical fingertip. For example, a modern smart phone may provide up to 20 distinct predefined areas, or even more, in its touch-sensitive display. The invention aims at eliminating or reducing the need to see the touch-sensitive display, in order to identify the distinct predefined areas. As regards the inventive tactile output section, however, it may be technically challenging to match the spatial resolution of the touch input section. The significance of the stimulus-variation means will be easiest to understand by assuming that the user touches the touch-sensitive display by only one finger at a time. Information on the area touched by the user's finger is detected by the presence-detecting means and relayed to the stimulus-variation means. The stimulus-variation means utilizes this information, such that touching different areas by the finger causes different electro-sensory stimuli to the finger. This means that tactile output section of the inventive interface apparatus may utilize relatively coarse spatial resolution and good temporal resolution to create an illusion of a spatial resolution that matches that of the touch input section. Under the assumption that the user touches the touch-sensitive display by only one finger at a time, even one electrode suffices to create an illusion of a much higher spatial resolution. In reality, the entire surface of the electrode provides the same stimulus intensity, but by varying the stimulus intensity based on information of the area touched by the user's finger, the inventive interface apparatus creates an illusion of multiple areas, each of which provides a distinct stimulus intensity. Such feedback may be provided by the interface section of device itself and/or the application-level program and/or the API that couples the application-level program to the interface device. Thus the inventive interface apparatus is capable of creating an illusion of a tactile output section with a spatial resolution exceeding its actual spatial resolution. An advantage of this feature is that the number of electrodes can be quite small, sometimes as low as one. The required number of electrodes equals the number of simultaneous, individually controlled stimuli. If, say, the tactile output section needs to create an individually controllable stimulus for each of two halves of the touch surface, two electrodes are sufficient. In many applications the user touches the touch surface with only one fingertip at a time, which means that one tactile output electrode suffices to create an illusion of a spatial resolution equal to that of the touch input section. Accordingly, the electrode(s) may be quite large, such as over 5 mm in both dimensions, up to the full size of the touch surface.

In an illustrative example, the electro-sensory stimulus is more intensive within the touch-sensitive areas. It is not necessary for the intensity of the electro-sensory stimulus to vary in precise accordance with the border(s) of the touch-sensitive area(s). For instance, assuming that the size and shape of the touch-sensitive areas correspond to a typical fingertip, it suffices to provide an intensity peak for the electro-sensory stimulus at the centre of each touch-sensitive area.

As an alternative to a comprehensive two-way interface apparatus which comprises the touch input section and tactile output section as described above, the invention can also be embodied as an upgrade to existing touch input devices. Accordingly, another aspect of the invention is a tactile output device, which comprises all features of the tactile output section as defined in claim 1. The tactile output device is adapted for installation into a touch input device comprising all features of the touch input section as defined in claim 1, such that installation of the tactile output device into the touch input device results in the interface apparatus according to claim 1.

The usage of the terms "interface apparatus", "device" and "section" is such that "apparatus" refers to a comprehensive two-way interface apparatus which comprises the touch input section and tactile output section. In other words, the two "sections" are portions of the comprehensive two-way interface apparatus. On the other hand, the word "device" is used in contexts where the tactile output device is provided separately, for upgrading an existing touch input device. Thus the terms "section" and "device" are functionally interchangeable, and the difference between them is such that "sections" form parts of a comprehensive apparatus, while "devices" may be sold separately, such that an inventive tactile output device may upgrade an existing touch input device such the upgrading results in an inventive interface apparatus.

The invention solves or at least alleviates the problems associated with prior art touch screen interfaces by providing the user with a spatially variant electro-sensory stimulus, wherein the spatial variations of the electro-sensory stimulus are based on the layout of the touch-sensitive areas of the touch screen interface. The expression "are based on" refers to the fact that a touch screen interface may comprise up to three superimposed layouts: a first layout defines the touch-sensitive areas, a second layout defines the spatially variant electro-sensory stimulus according to the present invention, while a third layout defines the visual cues which in prior art devices help the user see the layout of the switch matrix. The third layout (the visual cues), which is virtually mandatory in prior art devices, is optional in the inventive touch screen interlace because its function can be delegated to the inventive second layout, namely the spatially variant electro-sensory stimulus. Naturally, all the two or three layouts should correspond to one another but absolute precision is not required, so long as no confusion arises regarding which touch-sensitive area is currently activated.

Touch screen interfaces are frequently used in connection with equipment in which the keyboard or keypad legend varies over time. A prime example is an automat which serves customers in several languages. Another example is a multi-function remote controller, wherein the keypad legend varies depending on which set or piece of equipment is being controlled. A residual problem in touch screen interfaces is that the act of touching per se does not provide the user with any feedback as to whether the key press was accepted or not. This is why prior art touch screen interfaces are normally provided with a separate feedback system which may employ visual or aural information. But for the reasons stated above, visual feedback is not always satisfactory and aural feedback has its own problems, such as difficulty of detection in noisy surroundings.

Accordingly, some embodiments of the invention address the above-described feedback problems by providing electrosensory feedback indicating whether or not a touch-sensitive area is currently being activated.

In order to provide the electro-sensory stimulus which provides the user with an indication of the layout of the touch-sensitive areas, the touch screen interface according to the invention can be implemented by means of a capacitive electro-sensory interface as described in commonly assigned patent applications FI20075651, filed Sep. 18, 2007, or U.S. 60/960,899, filed Oct. 18, 2007, both titled "Sensory interface". Later in this document, the acronym "CEI" refers to a capacitive electro-sensory interface.

The electro-sensory stimulus generator is preferably dimensioned such that the electrosensory sensation is produced independently of relative motion between the user's body member, such as a finger, and the insulated electrode(s). Creation of the electrosensory sensation without finger movement provides the benefit that the user's finger can feel an underlying area, to which a function is assigned. Some prior art techniques require finger movement to create the electrosensory sensation. For instance, reference document 1 (Yamamoto) discloses a technique in which a variable electric field is used to modulate the frictional force between the finger and the underlying surface. This means that the inventive technique can provide an indication when the user's finger is (stationary) on top of a predefined area, whereas the prior art, as exemplified by Yamamoto, can only indicate when the user's finger is moving over the predefined area. The ability to provide an indication of a stationary finger on top of a predefined area brings about the benefit that the user may select the function assigned to the predefined area, and then let their finger rest in place to wait for an acknowledgment that the user's selection of function has been accepted. The acknowledgment may be provided by varying the electrosensory stimulus, while the user's finger is stationary on top of the predefined area.

BRIEF DESCRIPTION OF THE DRAWINGS

In the following the invention will be described in greater detail by means of specific embodiments with reference to the attached drawings, in which FIG. 1 illustrates the operating principle of a capacitive electro-sensory interface ("CEI");

FIG. 2 illustrates an embodiment of the CEI;

FIG. 3 shows an enhanced embodiment with multiple independently-controllable electrodes;

FIG. 4 shows a specific implementation of the embodiment shown in FIG. 3;

DETAILED DESCRIPTION OF SPECIFIC EMBODIMENTS

Figure 5:
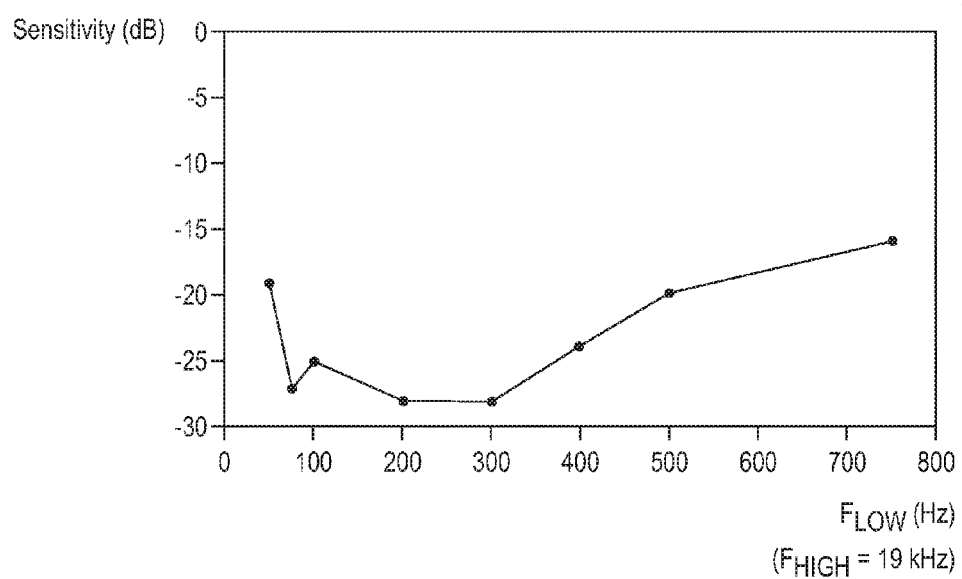
FIG. 5 is a graph which schematically illustrates the sensitivity of a test subject to sensations produced by the inventive capacitive electrosensory interface at various frequencies.

The embodiments described in the following relate to the operation and implementation of a capacitive electro-sensory interface ("CEI") which can be employed in the inventive touch screen interface.

FIG. 1 illustrates the operating principle of the CEI. Reference numeral 100 denotes a high-voltage amplifier. The output of the high-voltage amplifier 100, denoted OUT, is coupled to an electrode 106 which is insulated against galvanic contact by an insulator 108 which comprises at least one insulation layer or member. Reference numeral 120 generally denotes a body member to be stimulated, such as a human finger. Human skin, which is denoted by reference numeral 121, is a relatively good insulator when dry, but the CEI provides a relatively good capacitive coupling between the electrode 106 and the body member 120. The capacitive coupling is virtually independent from skin conditions, such as moisture. The inventors' hypothesis is that the capacitive coupling between the electrode 106 and the body member 120 generates a pulsating Coulomb force. The pulsating Coulomb force stimulates vibration-sensitive receptors, mainly those called Pacinian corpuscles which reside under the outermost layer of skin in the ipodermis 121. The Pacinian corpuscles are denoted by reference numeral 122. They are shown schematically and greatly magnified.

The high-voltage amplifier 100 is driven by a signal IN which results in a substantial portion of the energy content of the resulting Coulomb forces to reside in a frequency range to which the Pacinian corpuscles 122 are sensitive. For humans this frequency range is between 10 Hz and 1000 Hz, preferably between 50 Hz and 500 Hz and optimally between 100 Hz and 300 Hz, such as about 240 Hz. The frequency response of the Pacinian corpuscles is further discussed in connection with FIGS. 5 and 6.

It should be understood that, while "tactile" is frequently defined as relating to a sensation of touch or pressure, the electrosensory interface according to the present CEI, when properly dimensioned, is capable of creating a sensation of vibration to a body member even when the body member 120 does not actually touch the insulator 108 overlaying the electrode 106. This means that unless the electrode 106 and/or insulator 108 are very rigid, the pulsating Coulomb forces between the electrode 106 and body member 120 (particularly the Pacinian corpuscles 122) may cause some slight mechanical vibration of the electrode 106 and/or insulator 108, but the method and apparatus according to the CEI are capable of producing the electrosensory sensation independently of such mechanical vibration.

The high-voltage amplifier and the capacitive coupling over the insulator 108 are dimensioned such that the Pacinian corpuscles or other mechanoreceptors are stimulated and an electrosensory sensation (a sensation of apparent vibration) is produced. For this, the high-voltage amplifier 100 must be capable of generating an output of several hundred volts or even several kilovolts. In practice, the alternating current driven into the body member 120 has a very small magnitude and can be further reduced by using a low-frequency alternating current.

FIG. 2 illustrates an apparatus which implements an illustrative embodiment of the present CEI. In this embodiment the high-voltage amplifier 100 is implemented as a current amplifier 102 followed by a high-voltage transformer 104. In the embodiment shown in FIG. 2, the secondary winding of the high-voltage transformer 104 is in a more or less flying configuration with respect to the remainder of the apparatus. The amplifier 100, 102 is driven with a modulated signal whose components are denoted by 112 and 114. The output of the high-voltage amplifier 100 is coupled to an electrode 106 which is insulated against galvanic contact by the insulator 108. Reference numeral 120 generally denotes a member to be stimulated, such as a human finger. Human skin, which is denoted by reference numeral 121, is a relatively good insulator when dry, but the CEI provides a relatively good capacitive coupling between the electrode 106 and the electrically conductive tissue underneath the skin surface 121. Mechanoreceptors, such as the Pacinian corpuscles 122, reside in this conductive tissue. In FIGS. 1 and 2, the Pacinian corpuscles 122 are shown schematically and greatly magnified.

A benefit of the capacitive coupling between the electrode 106 and the electrically conductive tissue underneath the skin surface, which is known as the Corneus Layer and which contains the Pacinian corpuscles 122, is that the capacitive coupling eliminates high local current densities to finger tissue, which would result from contact that is conductive at direct current.

It is beneficial, although not strictly necessary, to provide a grounding connection which helps to bring the subject to be stimulated, such as the user of the apparatus, closer to a well-defined (non-floating) potential with respect to the high-voltage section of the apparatus. In the embodiment shown in FIG. 2, the grounding connection, denoted by reference numeral 210, connects a reference point REF of the high-voltage section to a body part 222 which is different from the body part(s) 120 to be stimulated. In the embodiment shown in FIG. 2, the reference point REF is at one end of the secondary winding of the transformer 104, while the drive voltage for the electrode(s) 206A, 206B, 206C is obtained from the opposite end of the secondary winding.

In an illustrative implementation, the apparatus is a hand-held apparatus which comprises a touch display activated by finger(s) 120. The grounding connection 210 terminates at a grounding electrode 212. An illustrative implementation of the grounding electrode 212 is one or more ground plates which are arranged such that they are conveniently touched one hand 222 of the user while the apparatus is manipulated by the other hand. The ground plate(s) may be positioned on the same side of the apparatus with the touch display and next to the touch display, or it/they may be positioned on adjacent or opposite side(s) from the side which comprises the touch display, depending on ergonomic considerations, for example.

In real-world apparatuses, the coupling 210 between the reference point REF and the non-stimulated body part 222 may be electrically complex. In addition, hand-held apparatuses typically lack a solid reference potential with respect to the surroundings. Accordingly, the term "grounding connection" does not require a connection to a solid-earth ground. Instead the grounding connection means any connection which helps to decrease the potential difference between the reference potential of the apparatus and a second body member distinct from the body member(s) to be stimulated. This definition does not rule out any capacitive parallel or stray elements, so long as the grounding connection 210 helps bring the user of the apparatus, along with the non-stimulated body part 222, to a potential which is reasonably well defined with respect to the high-voltage section of the apparatus. A capacitive grounding connection will be discussed in connection with FIG. 12. In the present context, the reasonably well-defined potential should be understood in view of the voltage OUT which drives the electrode(s) 206A, 206B, 206C. If the electrode drive voltage OUT is, say, 1000 V, a potential difference of, say, 100 V, between the user's body and the reference point REF may not be significant.

The non-capacitive coupling 210 between the reference point REF of the high-voltage section and the non-stimulated body part 222 greatly enhances the electro-sensory stimulus experienced by the stimulated body part 120. Conversely, an equivalent electro-sensory stimulus can be achieved with a much lower voltage and/or over a thicker insulator when the non-capacitive coupling 210 is being used.

The amplifier 100, 102 is driven with a high-frequency signal 112 which is modulated by a low-frequency signal 114 in a modulator 110. The frequency of the low-frequency signal 114 is such that the Pacinian corpuscles, which reside in the electrically conductive tissue underneath the skin surface, are responsive to that frequency. The frequency of the high-frequency signal 112 is preferably slightly above the hearing ability of humans, such as 18 to 25 kHz, more preferably between about 19 and 22 kHz. If the frequency of the signal 112 is within the audible range of humans, the apparatus and/or its drive circuit may produce distracting sounds. On the other hand, if the frequency of the signal 112 is far above the audible range of humans, the apparatus drives more current into the member 120. A frequency of about 20 kHz is advantageous in the sense that components designed for audio circuits can generally be used, while the 20 kHz frequency is inaudible to most humans. Experiments carried out by the inventors suggest that such modulation is not essential for the CEI. Use of a high-frequency signal with low-frequency modulation, such as the one schematically shown in FIG. 2, as opposed to a system which relies on the low-frequency signal alone, provides the benefit that the relatively high alternating voltage (a few hundred volts or a few kilovolts) can be generated with a relatively small transformer 104.

Terms like frequency or kHz should not be understood such that the high- or low-frequency signals 112, 114 are restricted to sinusoidal signals, and many other waveforms can be used, including square waves. The electrical components, such as the modulator 110, amplifier 102 and/or transformer 104 can be dimensioned such that harmonic overtones are suppressed. The inventors have discovered that pulses with durations of 4 ms (approximately one half-cycle of the low-frequency signal) or longer can be readily detected and with a practical insulator thickness the peak-to-peak voltage in the electrode 106 needs to be at least 500 V, preferably about 750 V. Unloaded peak-to-peak voltage measured in the electrode 106 should be in the range of approximately 750 V-100 kV. Near the lower limit of this voltage range, the insulator thickness may be 0.05-1 mm, for example. As material technology and nanotechnology develop, even thinner durable insulating surfaces may become available. This may also permit a reduction of the voltages used.

The elements of FIGS. 1 and 2 described so far produce a steady-state electrosensory sensation as long as the body member, such as the finger 120, is in the vicinity of the electrode 106. In order to convey useful information, the electrosensory sensation must be modulated. In some simple embodiments, such modulation can be implemented by positioning the electrode 106 such that useful information is conveyed by the fact that the finger 120 can sense the presence of the electrode 106. For example, the electrode 106 can be positioned over a switch, or in the vicinity of it, such that the switch can be detected without having to see it.

In other embodiments, such information-carrying modulation can be provided by electronically controlling one or more operating parameters of the inventive apparatus. The information-carrying modulation should not be confused with the modulation of the high-frequency signal 112 by the low-frequency signal 114, the purpose of which is to reduce the size of the transformer 104. In the schematic drawing shown in FIG. 2, such information-carrying modulation is provided by controller 116, which controls one or more of the operating parameters of the inventive apparatus. For instance, the controller 116 may enable, disable or alter the frequency or amplitude of the high- or low-frequency signals 112, 114, the gain of the amplifier 102, or it may controllably enable or disable the power supply (not shown separately) or controllably break the circuit at any point.

FIG. 3 shows an enhanced embodiment of the inventive apparatus with multiple independently-controllable electrodes. In FIG. 3, elements with reference numerals less than 200 have been described in connection with FIGS. 1 and 2, and a repeated description is omitted. This embodiment comprises multiple independently-controllable electrodes 206A, 206B and 206C, of which three are shown but this number is purely arbitrary. Reference numeral 216 denotes an implementation of a controller which controls a switch matrix 217 which provides the high-voltage signal OUT to the electrodes 206A, 206B and 206C under control of the controller 216. The controller 216 may be responsive to commands from an external equipment, such as a data processing equipment (not shown separately).

A benefit of the embodiment shown in FIG. 3 is that virtually all the drive circuitry, including the high-voltage amplifier 100, controller 216, and switch matrix 217, can be integrated into a common enclosure which is denoted by reference numeral 200. In this embodiment only the electrodes 206A, 206B and 206C and a single connecting wire for each electrode are outside the enclosure 200. As stated earlier, the electrodes need to be nothing more than simple conducting or semi-conducting plates covered by appropriate insulators. Therefore the enclosure 200 can be positioned in virtually any convenient position because the only elements external to it are very simple electrodes and connecting wires (and, in some implementations a power supply, not shown separately).

Some prior art systems provide direct stimulation of nerves via galvanic current conduction to the outermost layer of the skin. Because of the galvanic current conduction, such systems require two electrodes to stimulate an area of skin. In contrast to such prior art systems, the embodiment described in connection with FIG. 3 involves multiple electrodes 206A, 206B and 206C, but each electrode alone stimulates a distinct area of skin, or more precisely, the mechanoreceptors, including the Pacinian corpuscles underlying the outermost layers of skin. Therefore a configuration of n electrodes conveys n bits of information in parallel.

FIG. 4 shows a specific implementation of the embodiment shown in FIG. 3. In this implementation the switch matrix 217 comprises a bank of triacs 207A, 207B and 207C, but other types of semiconductor switches can be used, including semiconductor relays. Conventional electromechanical relays can be used as well. In this embodiment the switches (triacs) 207A, 207B and 207C are positioned logically after the transformer 104, ie, in the high-voltage circuitry. This implementation requires high-voltage switches (several hundred volts or several kilovolts) but it provides the benefit that the remainder of the circuitry, including the elements 100 through 114, can serve all of the electrodes 206A, 206B and 206C. As shown in FIG. 4, the controller 216 may be connectable to a data processing equipment, an example of which is shown here as a personal computer PC.

FIG. 5 is a graph which schematically illustrates the sensitivity of a randomly selected test subject to sensations produced by an apparatus substantially similar to the one shown in FIG. 2. The x-axis of the graph shows frequency of the low-frequency signal (item 114 in FIG. 2) multiplied by two, while the y-axis shows the amplitude required to detect an electrosensory stimulation. The amplitude scale is relative. The small dip at 75 Hz may be a measurement anomaly, or it may be caused by a sensitivity peak of mechanoreceptors other than Pacinian corpuscles. The reason for placing the doubled low-frequency signal on the x-axis is that the Coulomb forces between the electrode 106 and the body member 120 have two intensity peaks for each cycle of a sinusoidal low-frequency signal, as will be schematically illustrated in connection with FIG. 6.

The relative sensitivity at various frequencies is remarkably similar to the one published in section 2.3.1 (FIG. 2.2) of Reference document 2 (Gunther). Reference document 2 relates to vibrotactile (mechanical) stimulation of skin, but the similarity of the frequency response shown in FIG. 5 to the one published in Reference document 2 suggests that the present CEI operates such that the electrode 106 and the sensitive member 120 (see FIG. 1) form a capacitor over the insulator 108, and in that capacitor the oscillating Coulomb forces are converted to mechanical vibrations which are sensed by mechanoreceptors, including the Pacinian corpuscles. The inventors have also studied an alternative hypothesis wherein the Pacinian corpuscles are stimulated by current flowing through them, but this hypothesis does not explain the observations as well as the one which is based on Coulomb forces acting on the Pacinian corpuscles. However, the technical CEI described herein does not depend on the correctness of any particular hypothesis attempting to explain why the CEI operates the way it does.

Figure 6:
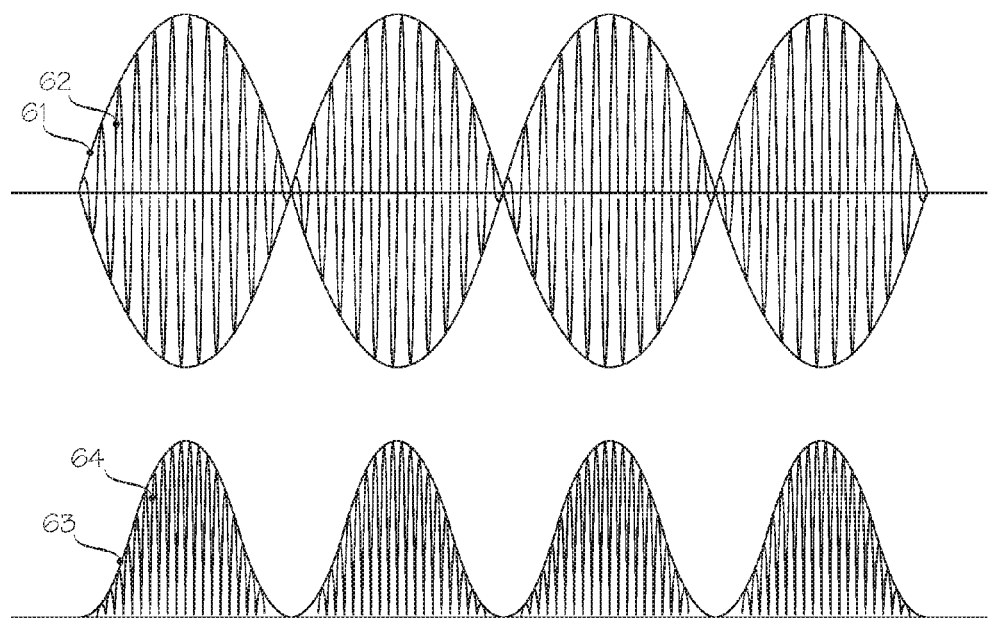
FIG. 6 is a graph which further clarifies the operating principle of the CEI.

FIG. 6 is a graph which further clarifies the operating principle of the CEI and the interpretation of frequencies in connection with the present CEI. Reference numeral 61 denotes the low-frequency drive signal to the modulator 110 (shown as item 114 in FIG. 2). Reference numeral 62 denotes the output of the modulator, ie, the high-frequency drive signal as modulated by the low-frequency drive signal.

Reference numerals 63 and 64 denote the resulting Coulomb forces in the capacitive coupling between the electrode 106 and the body member 120 over the insulator 108. Because the two sides of the capacitive coupling have opposite charges, the Coulomb force between the two sides is always attractive and proportional to the square of the voltage. Reference numeral 63 denotes the actual Coulomb force while reference numeral 64 denotes its envelope. The envelope 64 is within the range of frequencies to which the Pacinian corpuscles are sensitive, but because the Coulomb force is always attractive, the envelope 64 has two peaks for each cycle of the modulator output signal 62, whereby a frequency-doubling effect is produced. Because the Coulomb force is proportional to the square of the voltage, any exemplary voltages disclosed herein should be interpreted as effective (RMS) values in case the voltages are not sinusoidal.

The statement that the two sides of the capacitive coupling have opposite charges whereby the Coulomb force is always attractive holds for a case in which the apparatus and the body member to be stimulated are at or near the same potential. High static charges can cause deviations from this ideal state of affairs, which is why some form of grounding connection between a reference potential of the high-voltage source and the body element other than the one(s) to be stimulated is recommended, as the grounding connection helps to lower the potential differences between the apparatus and its user.

The CEI can be implemented as part of an input/output peripheral apparatus which is connectable to a data processing equipment. In such a configuration the data processing equipment can provide prompting and/or feedback via electrically-controllable electrosensory sensation.

Figure 7A:
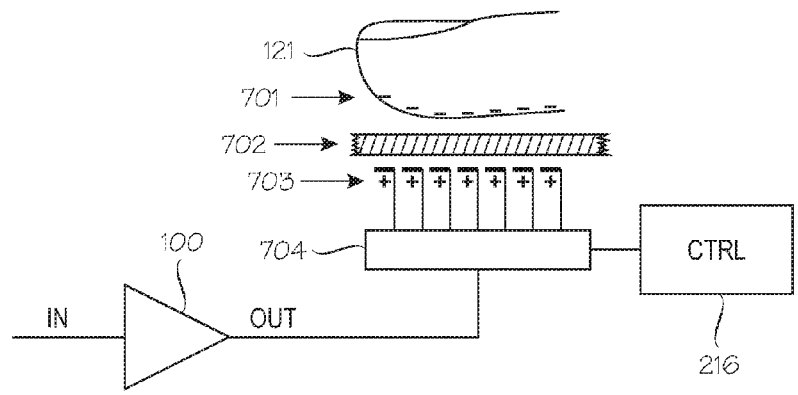
FIGS. 7A and 7B show an implementation of the CEI wherein the strength of the capacitive coupling is adjusted by electrode movement.
Figure 7B:
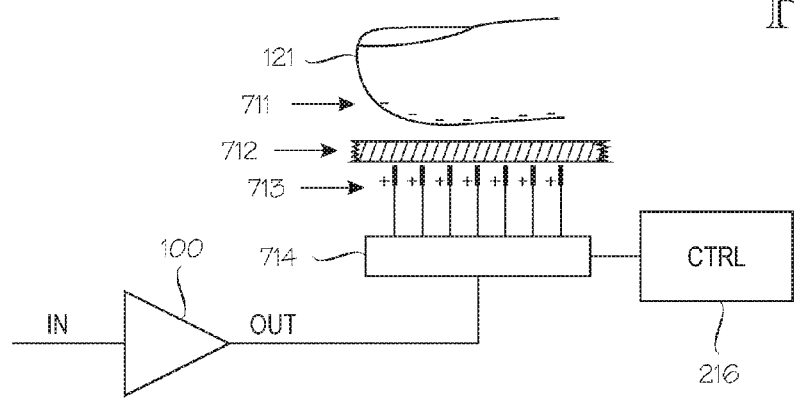

FIGS. 7A and 7B show implementations of the CEI wherein the strength of the capacitive coupling is adjusted by electrode movement. Generation of the electric field, and its variation as necessary, is effected via a set of electrodes 704 which comprises individual electrodes 703. The individual electrodes 703 are preferably individually controllable, wherein the controlling of an electrode affects its orientation and/or protrusion. FIG. 7A shows an implementation wherein a group of electrodes 703 are oriented, via the output signal from the controller 216, such that the electrodes 703 collectively form a plane under the insulator 702. In this situation the high-voltage current (DC or AC) from the high-voltage amplifier 100 to the electrodes 703 generates an opposite-signed charge of sufficient strength to a body member (eg the finger 120) in close proximity to the apparatus. A capacitive coupling between the body member and the apparatus is formed over the insulator 702, which may give rise to a sensory stimulus.

FIG. 7B shows the same apparatus shown in FIG. 7A, but in this case the strength of the capacitive coupling generated with the current from the high-voltage amplifier 100 is minimized by orienting the electrodes (now shown by reference numeral 714) such that they do not form a plane under the insulator 702. In some implementations of the present invention, the electric field alternating with a low frequency can be generated by alternating the state of the apparatus between the two states shown in FIGS. 7A and 7B. The frequency of the state alternation can be in the order of several hundred, eg 200 to 300 full cycles per second.

Figure 8:
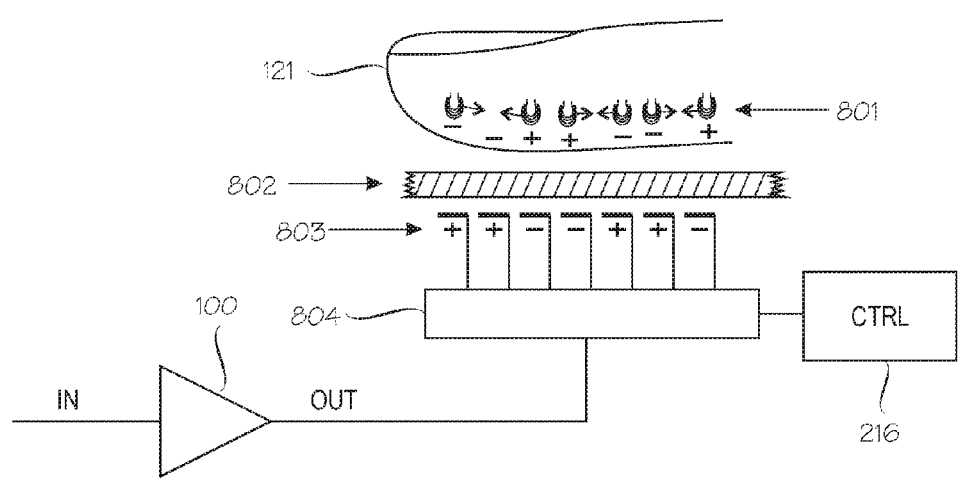
FIG. 8 shows an implementation of the CEI wherein the charges of different electrodes have opposite signs.

FIG. 8 shows an implementation of the CEI wherein the individual electrodes 803 in the set of electrodes 804 may have charges of opposite signs. The charges of individual electrodes 803 may be adjusted and controlled via the controller 216. The individual electrodes 803 may be separated by insulator elements 806, so as the prevent sparking or shorting between the electrodes. The capacitive coupling between the CEI and the body member proximate to it may give rise to areas having charges with opposite signs 801. Such opposing charges are mutually attractive to one another. Hence it is possible that coulomb forces stimulating the Pacinian corpuscles may be generated not only between the CEI and the body member but between infinitesimal areas within the body member itself.

Figure 9:
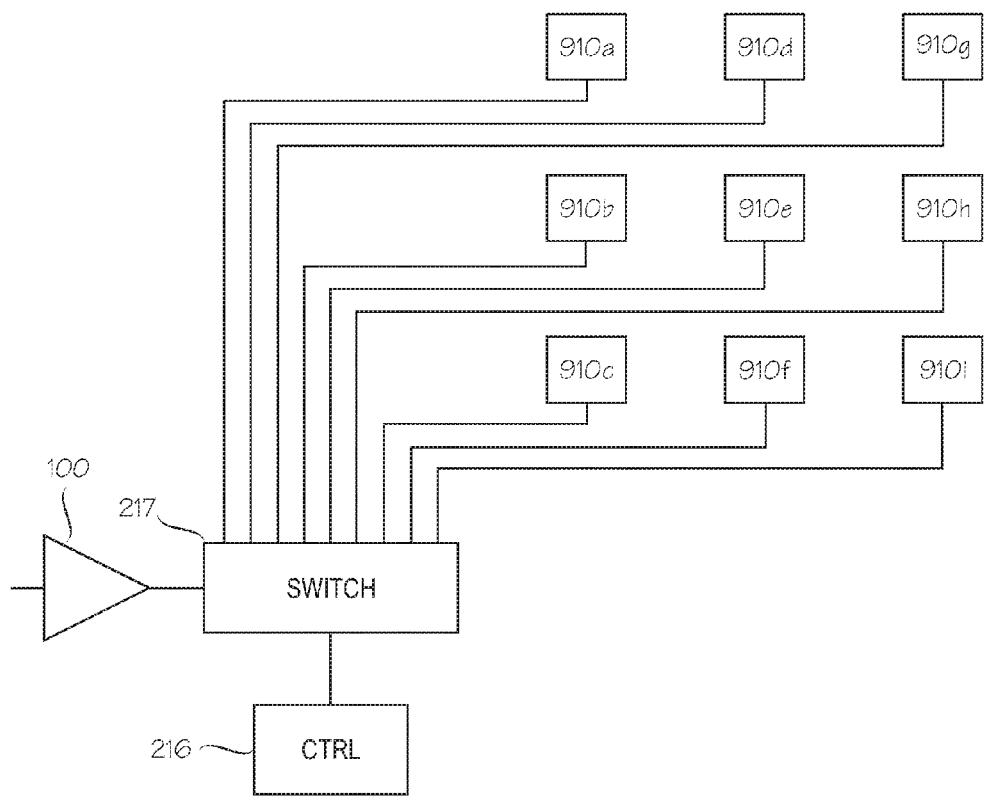
FIG. 9 shows an implementation of the CEI wherein a group of electrodes are organized in the form of a matrix.

FIG. 9 shows an implementation of the CEI wherein a group of individually controllable electrodes 910a through 910i are organized in the form of a matrix. Such a matrix can be integrated into a touch screen apparatus. Since the CEI described above does not require direct connection (touching) between the CEI and a body member of its user, the electrodes of the CEI apparatus can be positioned behind the touch screen, wherein "behind" means the side of the touch screen opposite to the side facing the user during normal operation. Alternatively, the electrodes can be very thin and/or transparent, whereby the electrodes can overlay the touch screen on the side normally facing the user. The electric charges, which are conducted from the high-voltage amplifier 100 to the electrodes 910a through 910i via the switch array 217, may all have similar signs or the charges conducted to different electrodes may have different signs, as illustrated in connection with FIG. 8. For instance, the controller 216 may control the switches in the switch array individually, or certain groups may form commonly-controllable groups. The surface of an individual electrode and/or its associated insulator can be specified according to the intended range of operations or applications. The minimum practical area is about 0.01 $cm^2$, while the practical maximum is roughly equal to the size of a human hand. It is expected that surface areas between 0.1 and 1 $cm^2$ will be found most usable in practice.

The matrix of electrodes 910a through 910i and the switch array 217 provide a spatial variation of the electro-sensory stimulation. In other words, the sensory stimulation provided to the user depends on the location of the user's body member, such as a finger, proximate to the CEI apparatus which is integrated to the inventive touch screen. The spatially varying sensory stimulation provides the user with an indication of the layout of the touch-sensitive areas of the touch screen interface.

In addition to the spatially varying sensory stimulation, the controller 216 may direct the switch array 217 to produce a temporally varying electro-sensory stimulation, which can be used for a wide variety of useful effects. For instance, the temporally varying electro-sensory stimulation can be used to indicate a detected activation of a touch-sensitive area ("key press"). This embodiment address a common problem associated with prior art touch screen apparatuses, namely the fact that a detection of a key press produces no tactile feedback. It is true that the application-level program used via the touch screen apparatus may provide visual or aural feedback, which exhibit various problems described earlier. In addition production of the visual or aural feedback from the application-level program causes a burden on the programming and execution of those programs. In some implementations of the invention, an interface-level or driver-level program provides a tactile feedback from a detected activation of a touch-sensitive area by using the temporally and spatially variant electro-sensory stimulation, and such interface-level or driver-level programs can be used by any application-level programs. For example, the application-level programs can be coupled to the inventive touch screen interface via an application programming interface ("API") whose set of available functions includes the feedback generation described above.

The temporally and spatially variant electro-sensory stimulation can also be used to change the layout of the touch-sensitive areas "on the fly". This operation is roughly analogous to changing the keyboard or keypad layout depending on the application program or user interface screen currently executed. However, when prior art touch screen apparatuses change keyboard or keypad layout on the fly, the new layout must be somehow indicated to the user, and this normally requires that the user sees the touch screen apparatus.

Some embodiments of the inventive interface apparatus eliminate the need to see the touch screen section or device, assuming that the layout of the touch-sensitive areas is sufficiently simple. For instance, up to about two dozen different "key legends" can be indicated to the user by providing different patterns for the temporally and spatially variant electro-sensory stimulation. As used herein, the expression "key legend" refers to the fact that prior art touch screen apparatuses, which produce no tactile feedback, normally produce visual cues, and these are commonly called "legends". In some embodiments of the present invention, the function of the key legends can be provided via different patterns. For instance, the following patterns can be identified with one fingertip: pulses with low, medium or high repetition rate; sweeps to left, right, up or down, each with a few different repetition rates; rotations clockwise or anti-clockwise, each with a few different repetition rates.

From the above, it is evident that the inventive electro-sensory interface can produce a large number of different touch-sensitive areas, each with a distinct "feel" (technically: a different pattern for the temporal and spatial variation of the electro-sensory stimulus). Hence the screen section of a conventional touch screen is not absolutely needed in connection with the present invention, and the term "touch input device" or "touch input section" should be interpreted as an interface equipment which, among other things, is suitable for applications commonly associated with touch screen equipment, although the presence of the screen is not mandatory.

Moreover, the strength of the capacitive coupling between the inventive CEI and a body member of its user (or the capacitive coupling between an individual electrode or a group of electrodes and the user's body member) can be determined by direct or indirect measurements. This measurement information can be utilized in various ways. For instance, the strength of the capacitive coupling can indicate the body member's proximity to the electrode, or it can indicate touching the electrode by the body member. Such measurement functionality can be provided by a dedicated measurement unit (not shown) or it can be integrated into one of the blocks described earlier, such as the switch matrix 217. The switch matrix 217 (or the optional dedicated measurement unit) can send the measurement information to the controller 216 which can utilize it to vary the electric fields generated by the electrodes, by varying the voltage or frequency. In addition or alternatively the controller 216 may forward the measurement information, or some information processed from it, to a data processing equipment, such as the personal computer PC shown in FIG. 4.

Yet further, two or more inventive interface devices can be interconnected via some communication network(s) and data processing equipment. In such an arrangement, the electro-sensory stimulation provided to the users of the touch screen devices may be based on some function of all users' contribution to the proximity to their respective devices. In one illustrative example, such an interconnection of two (or more) touch screen devices can provide their users with tactile feedback whose strength depends on the sum of the areas of hands touch the touch-sensitive areas. This technique simulates a handshake whose strength reflects the sum of hand pressure exerted by both (or all) users. In another illustrative example, a music teacher might "sense" how a remotely located student presses the keys of a simulated piano keyboard.

Figure 10:
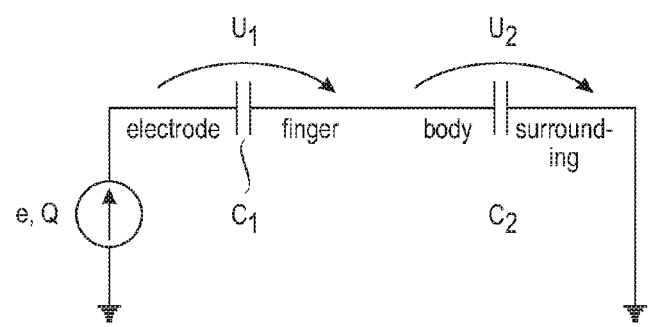
FIG. 10 illustrates distribution of an electric field-generating potential in capacitive couplings when the apparatus is grounded.

FIG. 10 illustrates distribution of an electric field-generating potential in capacitive couplings when the apparatus is grounded. The underlying theory is omitted here, and it suffices to say that in the arrangement shown in FIG. 10, the drive voltage e of an electrode is divided depending on based on the ratio of capacitances C1 and C2, wherein C1 is the capacitance between the finger and the electrode and C2 is the stray capacitance of the user. The electric field experienced by the finger is caused by voltage U1:

$$U_1 = \frac{C_2}{C_1 + C_2} e$$

This voltage is lower than the drive voltage e from the voltage source. In a general case the reference potential of the apparatus may be floating, as will be shown in FIG. 11. This arrangement further decreases the electric field directed to the body member, such as finger.

For these reasons some embodiments of the invention aim at keeping the capacitance C1 low in comparison to that of C2. At least capacitance C1 should not be significantly higher than C2. Some embodiments aim at adjusting or controlling C2, for instance by coupling the reference potential of the apparatus back to the user, as will be shown in FIG. 12.

Figure 11:
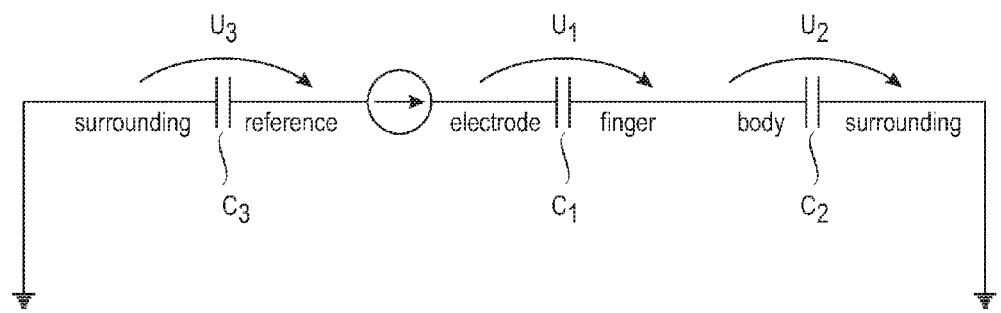
FIG. 11 illustrates distribution of an electric field-generating potential in capacitive couplings when the apparatus is floating (not grounded)
Figure 12:
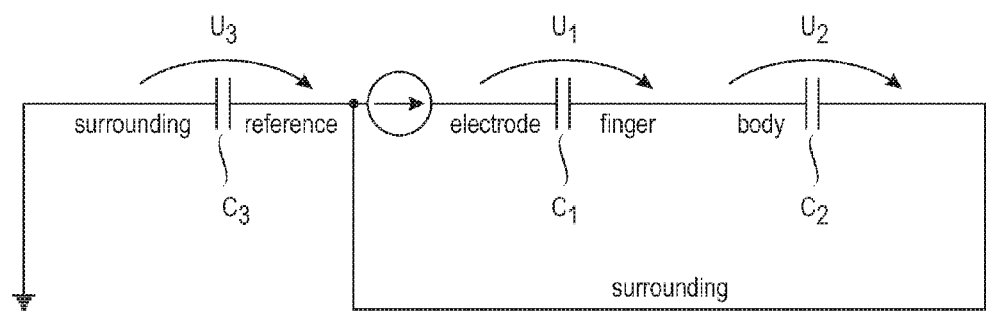
FIG. 12 illustrates distribution of an electric field-generating potential in capacitive couplings when the apparatus is floating and the user is sufficiently close to the apparatus and capacitively grounded to the ground (reference) potential of the apparatus.

Instead of the measures described in connection with FIGS. 10 through 12, or in addition to such measures, stray capacitances can be controlled by arrangements in which several electrodes are used to generate potential differences among different areas of the touch screen surface. By way of example, this technique can be implemented by arranging the touch-sensitive surface of a hand-held device (eg the top side of the device) to a first potential, while the opposite side is arranged to a second potential, wherein the two different potentials can be the positive and negative poles of the device. Alternatively, a first surface area can be the electric ground (reference potential), while a second surface area is charged to a high potential.

Moreover, within the constraints imposed by the insulator layer(s), it is possible to form minuscule areas of different potentials, such as potentials with opposite signs or widely different magnitudes, wherein the areas are small enough that the user's body member, such as finger, is simultaneously subjected to the electric fields from several areas with different potentials.

Figure 13:
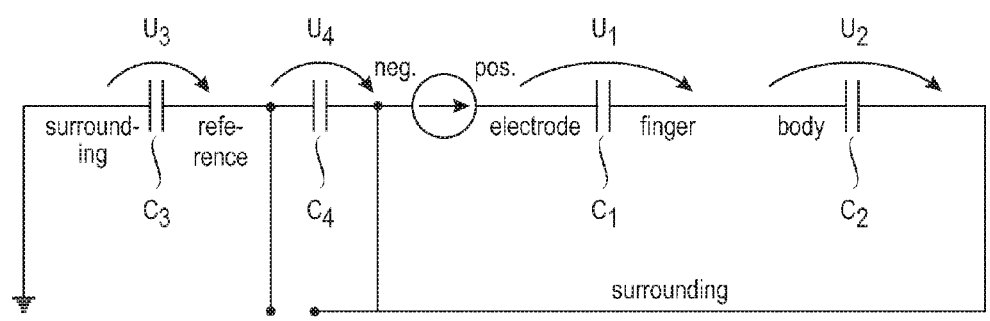
FIG. 13 shows an arrangement wherein capacitive couplings are utilized to detect touching.

FIG. 13 shows an embodiment in which the capacitive coupling is utilized to detect touching or approaching by the user's body member, such as finger. A detected touching or approaching by the user's body member can be passed as an input to a data processing equipment. In the embodiment shown in FIG. 13, the voltage source is floating. A floating voltage source can be implemented, via inductive or capacitive coupling and/or with break-before-make switches. A secondary winding of a transformer is an example of a simple yet effective floating voltage source. By measuring the voltage U4, it is possible to detect a change in the value(s) of capacitance(s) C1 and/or C2. Assuming that the floating voltage source is a secondary winding of a transformer, the change in capacitance(s) can be detected on the primary side as well, for example as a change in load impedance. Such a change in capacitance(s) serves as an indication of a touching or approaching body member.

In one implementation, the apparatus is arranged to utilize such indication of the touching or approaching body member such that the apparatus uses a first (lower) voltage to detect the touching or approaching by the body member and a second (higher) voltage to provide feedback to the user. For instance, such feedback can indicate any of the following: the outline of the/each touch-sensitive area, a detection of the touching or approaching body member by the apparatus, the significance of (the act to be initiated by) the touch-sensitive area, or any other information processed by the application program and which is potentially useful to the user.

Figure 14:
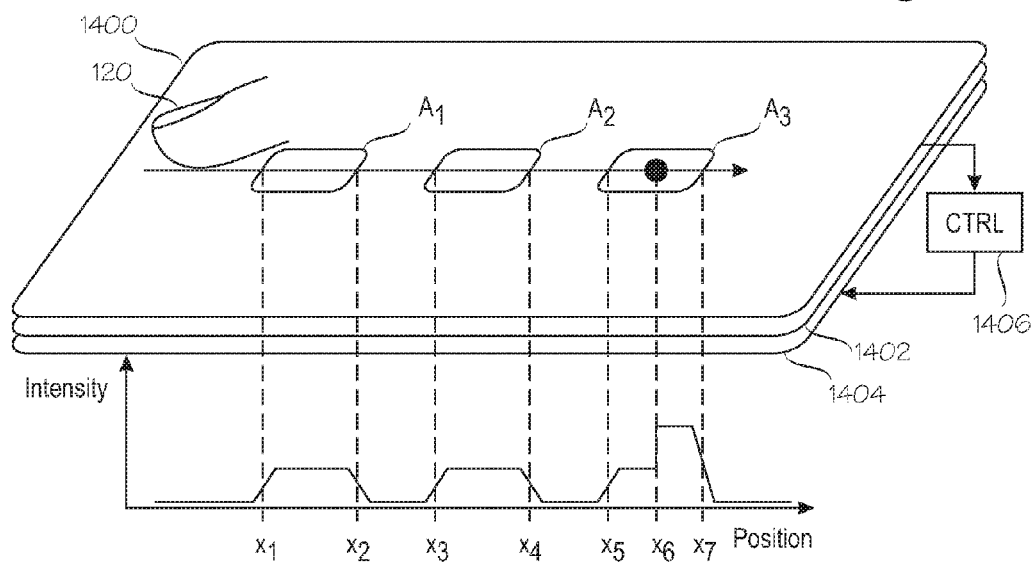
FIGS. 14 and 15 illustrate embodiments in which a single electrode and temporal variations in the intensity of the electro-sensory stimulus can be used to create illusions of a textured touch screen surface.

FIG. 14 schematically illustrates an embodiment in which a single electrode and temporal variations in the intensity of the electro-sensory stimulus can be used to create illusions of a textured touch screen surface. Reference numeral 1400 denotes a touch-sensitive screen which, for the purposes of describing the present embodiment, comprises three touch-sensitive areas $A_1$, $A_2$ and $A_3$. The approaching or touching by the touch-sensitive areas $A_1$, $A_2$ and $A_3$ of a user's finger 120 is detected by a controller 1406.

According to an embodiment of the invention, a conventional touch-sensitive screen 1400 can be complemented by a tactile output device according to an embodiment of the invention. Reference numeral 1404 denotes an electrode which is an implementation of the electrodes described in connection with previously-described embodiments, such as the electrode 106 described in connection with FIGS. 1 and 2. A supplemental insulator 1402 may be positioned between the touch-sensitive screen 1400 and the inventive electrode 1404, in case the touch-sensitive screen 1400 itself provides sufficient insulation.

In addition to conventional touch-screen functionality, namely detection of approaching or touching by the touch-sensitive areas by the user's finger, the controller 1406 uses information of the position of the finger 120 to temporally vary the intensity of the electro-sensory stimulation invoked by the electrode 1404 on the finger 120. Although the intensity of the electro-sensory stimulation is varied over time, time is not an independent variable in the present embodiment. Instead, timing of the temporal variations is a function of the position of the finger 120 relative to the touch-sensitive areas (here: $A_1$, $A_2$ and $A_3$). Thus it is more accurate to say that the present embodiment is operable to cause variations in the intensity of the electro-sensory stimulation invoked by the electrode 1404 on the finger 120, wherein the variations are based on the position of the finger 120 relative to the touch-sensitive areas.

The bottom side of FIG. 14 illustrates this functionality. The three touch-sensitive area $A_1$, $A_2$ and $A_3$ are demarcated by respective x coordinate pairs $\{x_1, x_2\}$, $\{x_3, x_4\}$ and $\{x_5, x_7\}$. (Processing in the y direction is analogous and a detailed description is omitted.) The controller 1406 does not sense the presence of the finger, or senses the finger as inactive, as long as the finger is to the left of any of the touch-sensitive areas $A_1$, $A_2$ and $A_3$. In this example the controller 1406 responds by applying a low-intensity signal to the electrode 1404. As soon as the finger 120 crosses the x coordinate value $x_1$, the controller 1406 detects the finger over the first touch-sensitive area $A_1$ and starts to apply a medium-intensity signal to the electrode 1404. Between the areas $A_1$ and $A_2$ (between x coordinates $x_2$ and $x_3$), the controller again applies a low-intensity signal to the electrode 1404. The second touch-sensitive area $A_2$ is processed similarly to the first touch-sensitive area $A_1$, but the third touch-sensitive area $A_3$ is processed somewhat differently. As soon as the controller 1406 detects the finger 120 above or in close proximity to the area $A_3$, it begins to apply the medium-intensity signal to the electrode 1404, similarly to areas $A_1$ and $A_2$. But the user decides to press the touch screen 1400 at a point x6 within the third area $A_3$. The controller 1406 detects the finger press (activation of the function assigned to the area $A_3$) and responds by applying a high-intensity signal to the electrode 1404.

Thus the embodiment shown in FIG. 14 can provide the user with a tactile feedback which creates an illusion of a textures surface, although only a single electrode 1404 was used to create the electro-sensory stimulus. A residual problem is, however, that the user has to memorize the significance of the several touch-sensitive areas or obtain visual or aural information on their significance.

Figure 15:
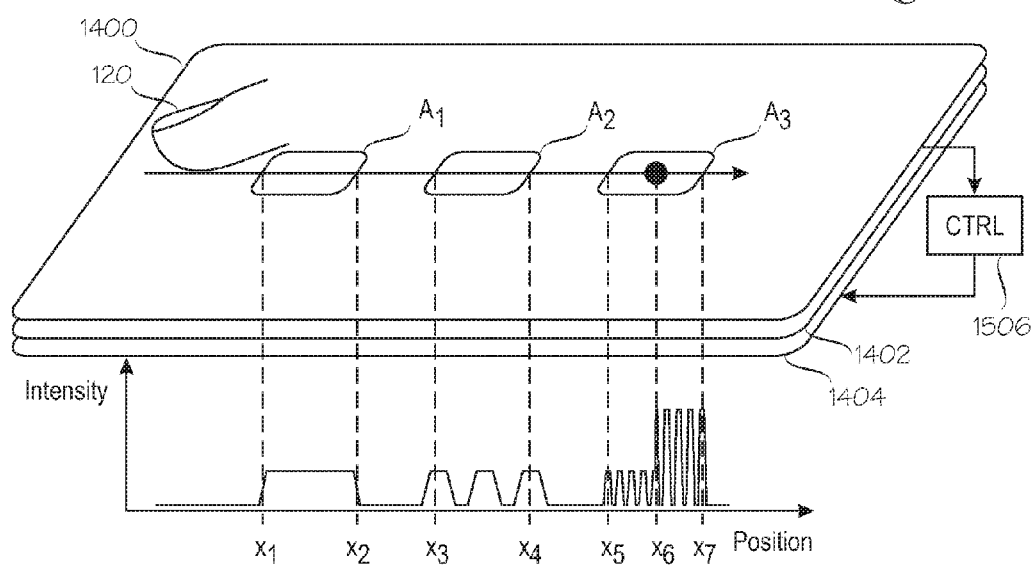

FIG. 15 shows a further enhanced embodiment from the one described in connection with FIG. 14. The embodiment shown in FIG. 15 uses different temporal variations of the intensity of the electro-sensory stimulus, wherein the different temporal variations provide the user with a tactile feedback indicating the significance of the touch-sensitive areas.

The operation of the embodiment shown in FIG. 15 differs from the one described in connection with FIG. 14 in that the controller, here denoted by reference numeral 1506, applies different temporal variations to the intensity of the signal to the electrode 1404. In this example, the first touch-sensitive area $A_1$ is processed similarly to the preceding embodiment, or in other words, the intensity of the electro-sensory stimulus depends only on the presence of the finger 120 in close proximity to the area $A_1$. But in close proximity to areas $A_2$ and $A_3$, the controller 1506 also applies temporal variations to the intensity of the electro-sensory stimulus. For example the significance (coarsely analogous with a displayed legend) of area $A_2$ is indicated by a pulsed electro-sensory stimulus at a first (low) repetition rate, while the significance of area $A_3$ is indicated by a pulsed electro-sensory stimulus at a second (higher) repetition rate. In an illustrative example, the three touch-sensitive areas $A_1$, $A_2$ and $A_3$ can invoke the three functions in a yes/no/cancel-type user interface, wherein the user can sense the positions of the user interface keys (here: the three touch-sensitive areas) and the indication of an accepted input only via tactile feedback. In other words, the user needs no visual or aural information on the positions of the touch-sensitive areas or on the selected function. The embodiment described in connection with FIG. 15 is particularly attractive in car navigators or the like, which should not require visual attention from their users.

In the embodiments shown in FIGS. 14 and 15, when the user's finger 120 has selected the function assigned to area $A_3$ and the controller CTRL 1406, 1506 generates the high-intensity electro-sensory stimulus via the electrode 1404, the high-intensity stimulus is sensed via any of the areas $A_1$, $A_2$ and $A_3$. In other words, if one finger of the user presses the area $A_3$, other finger(s) in close proximity to the other areas $A_2$ and/or $A_3$ will also sense the high-intensity stimulus. In cases where this is not desirable, the embodiments shown in FIGS. 14 and 15 can be combined with the multi-electrode embodiment disclosed in connection with FIG. 9, such that the signal to each of several electrodes (shown in FIG. 9 as items 910a through 910i) is controlled individually.

In the scenarios shown in FIGS. 14 and 15, the variation of the electrosensory stimulus on the finger 120 was synchronized on the basis of the finger's movement over the areas $A_1$, $A_2$ and $A_3$. But unlike some prior art technologies, such as the one disclosed in reference document 1, the present invention does not require finger movement to create the electrosensory stimulus or the user's sensation. In other words, the illusion of a textured surface is based on the finger's position (and the stimulus intensity applied by the controller at the various positions) but not on finger movement.

Figure 16A:
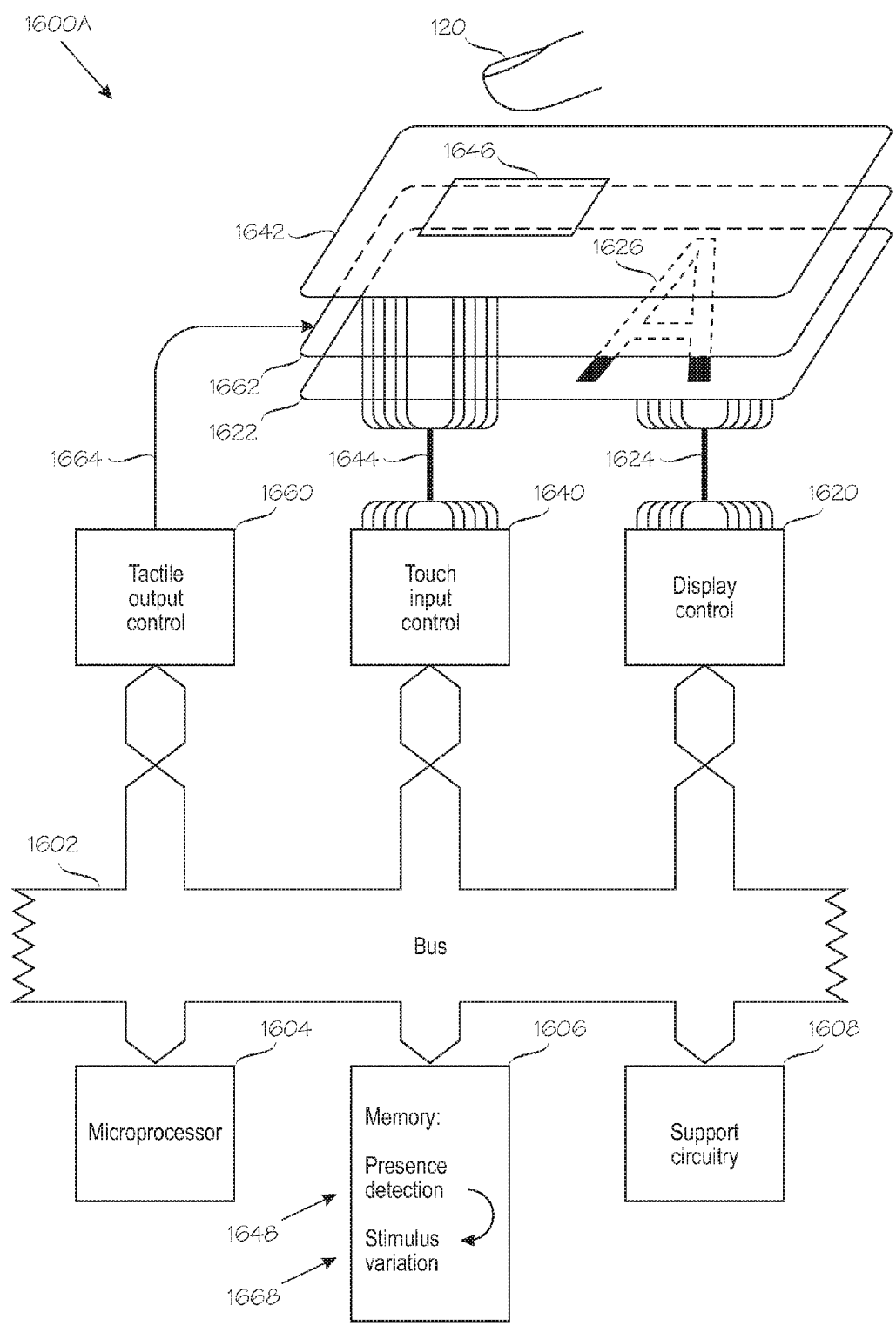
FIG. 16A shows an embodiment of the invention in which the electrode(s) for the tactile output section are positioned between the touch input section and the display layer.

FIG. 16A shows an embodiment of the invention in which the electrode(s) for the tactile output section are positioned between the touch input section and the display layer. The present embodiment, generally denoted by reference numeral 1600A, comprises a bus 1602 providing inter-element connections between a microprocessor 1604, memory 1606, processor support circuitry 1608, display controller 1620 and touch input controller 1640. The display controller 1620 control a display 1622, such as a liquid-crystal display via an array of connecting wires 1624. In a similar manner, the touch input controller 1640 control a touch-sensitive layer 1642 via an array of connecting wires 1644.

The embodiment 1600A also comprises a tactile output section, which is comprised of a tactile output controller 1660 and an insulated electrode layer 1662, interconnected by an interconnection wire 1664. In FIG. 16A, the emphasis on integration of the tactile output section 1660-1662 with a substantially known touch-sensitive display, including the elements 1602 through 1644. For details of the tactile output controller 1660 and the insulated electrode layer 1662, a reference is made to the previously described embodiments.

As shown in FIG. 16A, the display layer shows information, generally denoted by reference numeral 1626, which is seen by the user via the touch-sensitive layer 1642 and the insulated electrode layer 1662. The touch-sensitive layer 1642 is scanned by the touch input controller 1640, such that the microprocessor 1604, under control of software stored in and executed from the memory 1606, is aware of the presence or absence of the user's finger 120 on top of a predefined area 1646. The surface of the touch-sensitive layer 1642 may be completely homogenous, and the predefined areas, one of which is indicated by reference numeral 1646, are created dynamically by the microprocessor, under control of the software, such that the X and Y coordinates of the user's finger, as it touches the touch-sensitive layer 1642, are compared with predefined borders of the predefined area 1646. Reference numeral 1648 denotes a presence-detection logic within the memory 1606. Execution of the presence-detection logic 1648 by the microprocessor 1604 causes the detection of the presence or absence of the user's finger 120 at the predefined area 1646. A visual cue, such as a name of the function or activity associated with the predefined area, is typically displayed on the display 1622, as part of the displayed information 1626, so as to help the user find the desired area 1646.

Reference numeral 1668 denotes a stimulus-variation logic within the memory 1606. Input information to the stimulus-variation logic 1668 includes information on the presence or absence of the user's finger 120 at the predefined area 1646. Based on this presence information, the stimulus-variation logic 1668 has the effect that the microprocessor 1604 instructs the tactile output controller 1660 to vary the electrical input to the electrode layer 1662, thus varying the electrosensory stimulus caused to the body member 120. Thus it is possible for the user to detect the presence or absence of the body member 120 at the predefined area 1646, as well as a feedback caused by activation of a function associated with the predefined area 1646, merely via tactile information, that is, without requiring the visual clues.

Figure 16B:
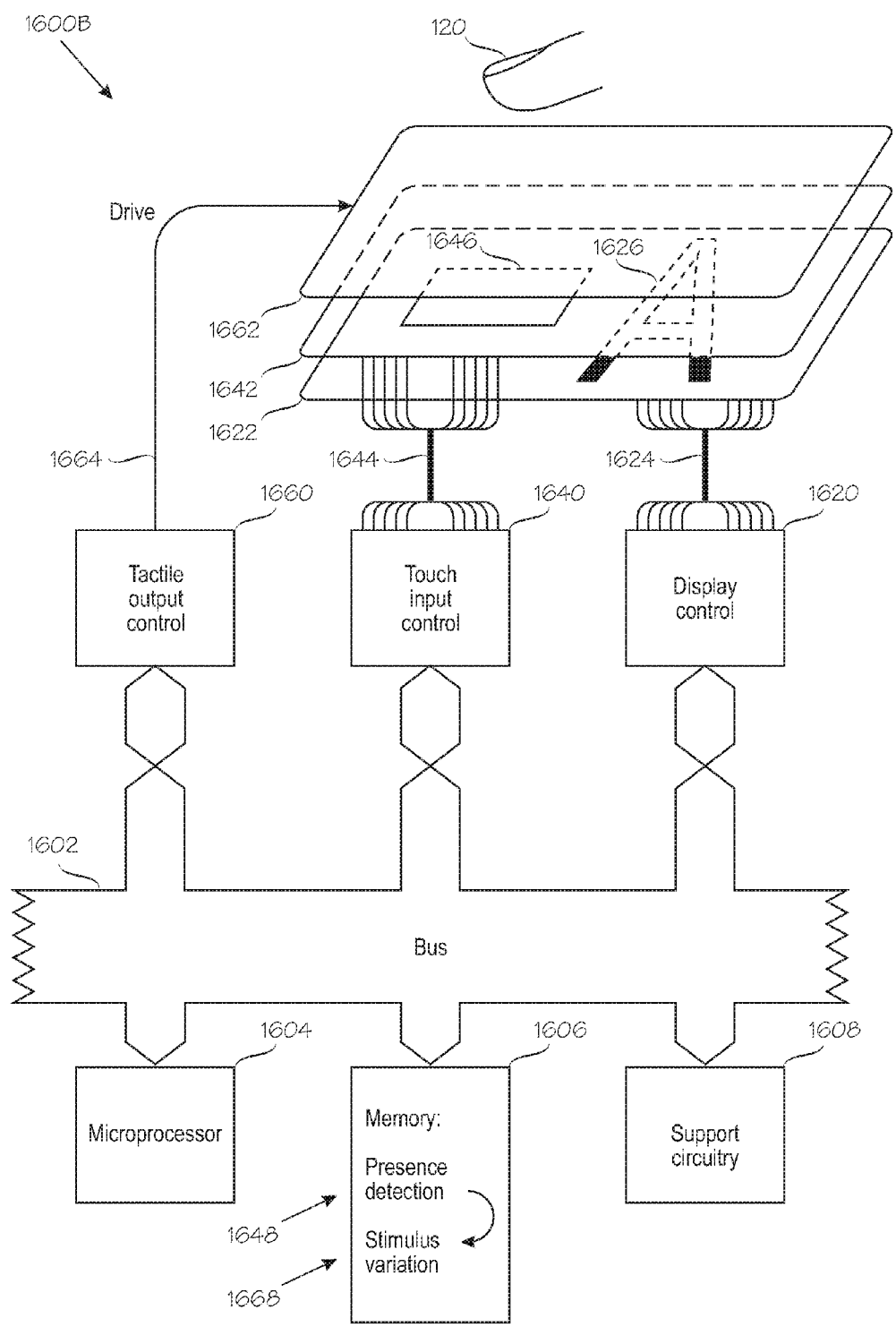
FIG. 16B shows an embodiment of the invention in which the electrode(s) for the tactile output section are positioned on top of a touch input section, which in turn is positioned on top of a display layer.

FIG. 16B shows an embodiment of the invention in which the electrode(s) for the tactile output section are positioned on top of a touch input section, which in turn is positioned on top of a display layer. As used in the present context, "X is on top of Y" means that X is closer to the user's eyes than Y, when the apparatus is in normal operation position. In most respects, the present embodiment, generally denoted by reference numeral 1600B is very similar to the embodiment 1600A shown in FIG. 16A, and only the differences are described. A first difference is simply a reversed mutual order of the insulated electrode layer 1662 and the touch-sensitive layer 1642. A second difference is that because the insulated electrode layer 1662 resides on top of the touch-sensitive layer 1642, the insulated electrode layer 1662 must be divided into several relatively small electrically floating sections, so as not to interfere with the underlying touch-sensitive layer 1642, which is typically based on capacitive detection.

The embodiment 1600A shown in FIG. 16A provides the benefit that the insulated electrode layer 1662 resides underneath the touch-sensitive layer 1642 and cannot interfere with its operation. On the other hand, the embodiment 1600B shown in FIG. 16B more easily lends itself to upgrade devices for pre-existing touch-sensitive displays.

In some implementations, it is beneficial to provide a floating energy feed and signalling interface to the touch input section of the interface apparatus. Benefits of the floating coupling include the possibility to share elements between the touch-sensitive layer 1642 and the insulated electrode layer 1662. For instance, a conductive film may act as both the touch-sensitive layer 1642 and the insulated electrode layer 1662. The tactile output controller 1660 may be isolated from the bus 1602, wherein the isolation is applied to both energy feed and signalling. Energy feed to the tactile output controller 1660 may be inductive or capacitive, for example. Optical isolation may be used for signalling. This makes it possible to use the touch-sensitive layer 1642, together with its control electronics, also as the insulated electrode layer 1662. The insulation for the floating coupling can be installed on either side of the touch input controller 1640.

One specific implementation involves creating a patterned structure on top of capacitive sensing area. The patterned structure has areas of different conductivity. When the topmost electrosensory layer is not charged to a high voltage for usage as a tactile output, it provides a spatial distribution of conductivity to an underlying capacitive detector or a grid of capacitive detectors which respond to variations of the capacitive coupling between the user's finger and the capacitive sensing area as the user's finger approaches or touches various positions of the sensing area. Such a grid for capacitive sensing may be called a projected capacitive screen. The capacitive detectors are operated at a relatively high frequency compared to the capacitive output system. The input devices typically operate using frequencies from several kilohertz to several megahertz, while the capacitive electrosensory output system operates at a frequency between a few dozes and a few hundred Hertz. Thus the capacitive input is able to detect the location of the touching body member. When the tactile output is used in the low frequency range, the top layer becomes approximately evenly charged and provides the electrosensory tactile output. In the case of a touch screen, the conductive areas can be made of indium tin oxide (ITO), for example, and the less conductive areas can be made of either thinner, less conductive, ITO or a semiconductive transparent polymer, for example.

Grounding of the interface apparatus and its user was studied in connection with FIGS. 10 through 13 by means of equivalent diagrams. As regards practical implementation, grounding may be of capacitive or galvanic (resistive or semiconductive) in nature. Capacitive grounding isolates direct current while the other forms of grounding conduct direct current at least to some degree. While galvanic grounding, ie, grounding via negligible resistance, is functionally good, in some circumstances it may be uncomfortable to the user because of intensive static discharges. In an implementation with multiple individually controlled electrodes, a ground reference for an electrode may be provided by its neighbour electrodes.

It is readily apparent to a person skilled in the art that, as the technology advances, the inventive concept can be implemented in various ways. The invention and its embodiments are not limited to the examples described above but may vary within the scope of the claims.

REFERENCES

1. Yamamoto, A. et al., *"Electrostatic Tactile Display with Thin Film Slider and Its Application to Tactile Telepresentation Systems"*, IEEE Transactions on Visualization and Computer Graphics, Vol. 12, Issue 2, March-April 2006, p. 168-177.
2. Gunther, Eric: *"Skinscape: A Tool for Composition in the Tactile Modality"* Master's thesis, Massachusetts Institute of Technology 2001, available on the Internet at address: http://mf.media.mit.edu/pubs/thesis/guntherMS.pdf

The invention claimed is:

1. An apparatus comprising:
 a touch surface configured to be touched by a body member;
 a detection circuitry configured to detect a presence or absence of the body member on the touch surface at a position on the touch surface;
 at least one electrode;
 a voltage source configured to provide an electrical charge to the at least one electrode;
 an insulation layer configured to form at least part of a capacitive coupling between the at least one electrode and the body member, the capacitive coupling producing a Coulomb force directly on the body member in which mechanoreceptors are caused by the Coulomb force to experience a sensation in the body member from stimulation of the mechanoreceptors within the body member by oscillations in the Coulomb force, the insulation layer to inhibit a flow of direct current between the at least one electrode and the body member; and
 a controller configured to vary the sensation in the body member on which the Coulomb force is directly produced, wherein the sensation in the body member is varied by varying the electrical charge applied to the at least one electrode based on detection of the presence or the absence of the body member at the position on the touch surface.

2. The apparatus of claim 1, comprising a plurality of touch sensitive areas each having an associated position, the controller being configured to individually vary the sensation in each touch sensitive area.

3. The apparatus of claim 2, wherein the plurality of touch sensitive areas are separated by a grid.

4. The apparatus of claim 2, comprising a plurality of electrodes, each electrode being associated with a touch sensitive area.

5. The apparatus of claim 4, wherein the detection circuitry is configured to detect a simultaneous touching at multiple touch sensitive areas, and the controller provides a different sensation in each of the multiple touch sensitive areas.

6. The apparatus of claim 1, comprising a touch input section including the touch surface and the detection circuitry, and a tactile output section including the at least one electrode, the touch input section and the tactile output section sharing a conductive layer.

7. The apparatus of claim 1, wherein the touch surface is part of a touch sensitive display, the at least one electrode being integrated within the touch sensitive display to allow the sensation in the body member touching the touch sensitive display.

8. The apparatus of claim 1, wherein the detection circuitry is part of a touch sensitive display, the at least one electrode being an insulated electrode layer provided on an exposed surface of the touch sensitive display.

9. The apparatus of claim 1, wherein the at least one electrode comprises an electrode layer having a plurality touch sensitive areas separated from one another by a grid that has a conductivity lower than a conductivity of the plurality of touch sensitive areas.

10. The apparatus of claim 9, wherein when the body member is proximate to the grid, the Coulomb force produced by the capacitive coupling is different than the Coulomb force produced by the capacitive coupling when the body member is proximate to a touch sensitive area among the plurality of touch sensitive areas.

11. The apparatus of claim 1, wherein a touch input section including the touch surface and the detection circuitry is galvanically isolated from the at least one electrode.

12. The apparatus of claim 11, wherein the at least one electrode forms part of a tactile output section, the tactile output section supplying power to the touch input section.

13. The apparatus of claim 1, wherein the at least one electrode is an electrode layer comprising a plurality of electrically floating sections.

14. The apparatus of claim 1, wherein the position corresponds to one of a plurality of touch sensitive areas and a function is assigned to the touch sensitive area to provide an input to an application program.

15. The apparatus of claim 14, wherein the controller is configured to provide different sensations in different touch sensitive areas.

16. The apparatus of claim 14, wherein the functions are programmable.

17. The apparatus of claim 16, wherein more than one function is assignable to a single touch sensitive area.

18. The apparatus of claim 17, wherein detecting a first touch by the body member corresponds to a first function and detecting a second touch within a time window corresponds to a second function.

19. The apparatus of claim 1, wherein a plurality of key legends are displayed by the apparatus, each a key legend being at an associated position and the controller providing different sensations corresponding to different key legends to provide feedback based a selection of a key legend.

20. The apparatus of claim 1, wherein the power source is configured to provide the power with a first frequency component in a frequency range between 1 Hz and 1000 Hz.

21. The apparatus of claim 20, wherein the power source is configured to provide the power with a second frequency component having a frequency that is higher than the frequency of the first frequency component and lower than 500 kHz.

22. The apparatus of claim 21, further comprising a modulator to modulate the second frequency component based on the first frequency component.

23. The apparatus of claim 1, further comprising:
a grounding electrode separate from the at least one electrode, the grounding electrode being positioned to be touched by a different body member distinct from the body member to be stimulated.

24. The apparatus of claim 1, wherein a grounding connection is provided between a reference voltage of the power source and the grounding electrode.

25. The apparatus of claim 1, wherein the controller varies the power applied to the at least one electrode to induce the sensation at the position on the touch surface without movement of the body member.

26. The apparatus of claim 1, wherein the sensation is produced independent of any mechanical vibration of the apparatus.

27. The apparatus of claim 1, comprising:
a processor; and
memory to store instructions which, when executed by the processor, cause the controller to vary the power applied to the at least one electrode based on the detecting the presence or absence of the body member at the position.

28. The apparatus of claim 27, wherein the instructions cause the processor to assign a function associated with the position.

29. The apparatus of claim 1, further comprising a display layer to display information proximate the position, the information corresponding to at least one function selectable by a user.

30. The apparatus of claim 1, wherein varying the power applied to electrode includes modulating a frequency of the power.

31. A method of providing a tactile output on a touch sensitive display, the method comprising:
detecting a presence or absence of a body member on a touch surface of the touch sensitive display at a position on the touch surface;
providing an electrical charge to at least one electrode to form a capacitive coupling between the at least one electrode and the body member, the capacitive coupling producing a Coulomb force directly on the body member in which mechanoreceptors are caused by the Coulomb force to experience a sensation in the body member from stimulation of the mechanoreceptors within the body member by oscillations in the Coulomb force, the capacitive coupling being provided at least in part by an insulation layer, the electrical charge being to provide the sensation to the body member, the insulation layer to inhibit a flow of direct current between the at least one electrode and the body member; and
varying the sensation in the body member on which the Coulomb force is directly produced, wherein the sensation in the body member is varied by varying the electrical charge applied to the at least one electrode based on the detecting of the presence or the absence of the body member at the position on the touch surface.

32. The method of claim 31, comprising:
detecting the presence or absence of a body member in a plurality of touch sensitive areas each having an associated position; and
individually varying sensations in the body member in each touch sensitive area among the plurality of touch sensitive areas.

33. The method of claim 32, comprising assigning one or more functions to each touch sensitive area.

34. A non-transitory computer readable medium embodying instructions which, when executed by a machine cause the machine to perform operations including:
detecting the presence or absence of a body member on a touch surface of a touch sensitive display at a position on the touch surface;
providing an electrical charge to at least one electrode to form a capacitive coupling between the at least one electrode and the body member, the capacitive coupling producing a Coulomb force directly on the body member in which mechanoreceptors are caused by the Coulomb force to experience a sensation in the body member from stimulation of mechanoreceptors within the body member by oscillations in the Coulomb force, the capacitive coupling being provided at least in part by an insulation layer, the power being to provide the sensation in the body member, the insulation layer to inhibit a flow of direct current between the electrode and the body member; and
varying the sensation in the body member on which the Coulomb force is directly produced, wherein the sensation in the body member is varied by varying the electrical charge applied to the at least one electrode based on the detecting of the presence or the absence of the body member at the position on the touch surface.

35. The apparatus of claim 1, wherein:
the capacitive coupling produces the Coulomb force directly on the body member in which the mechanoreceptors include Pacinian corpuscles within the body member.

36. The apparatus of claim 1, wherein:
the capacitive coupling produces the Coulomb force directly on the body member which the mechanoreceptors are caused to experience the sensation by the oscillations in the Coulomb force in a frequency range between 10 Hz and 1000 Hz.

* * * * *